US011152181B2

(12) United States Patent
Tsambos

(10) Patent No.: US 11,152,181 B2
(45) Date of Patent: Oct. 19, 2021

(54) ESTIMATION OF CATHODE SPACE CURRENT FOR A THERMIONIC VACUUM TUBE USING A POLYNOMIAL BASED ON A HEURISTICALLY DETERMINED VARIABLE REPRESENTING THE GRID AND PLATE VOLTAGES

(71) Applicant: Panayotis Tsambos, Sydney (AU)

(72) Inventor: Panayotis Tsambos, Sydney (AU)

(73) Assignee: Panayotis Tsambos, Sydney (AU)

( * ) Notice: Subject to any disclaimer, the term of this patent is extended or adjusted under 35 U.S.C. 154(b) by 334 days.

(21) Appl. No.: 16/415,150

(22) Filed: May 17, 2019

(65) Prior Publication Data
US 2019/0362926 A1 Nov. 28, 2019

Related U.S. Application Data

(60) Provisional application No. 62/675,214, filed on May 23, 2018.

(51) Int. Cl.
| | |
|---|---|
| *G01R 19/00* | (2006.01) |
| *H01J 1/15* | (2006.01) |
| *H01J 9/04* | (2006.01) |
| *H01J 1/14* | (2006.01) |
| *H01J 1/13* | (2006.01) |

(52) U.S. Cl.
CPC .............. *H01J 1/15* (2013.01); *G01R 19/00* (2013.01); *H01J 1/135* (2013.01); *H01J 1/14* (2013.01); *H01J 9/042* (2013.01)

(58) Field of Classification Search
None
See application file for complete search history.

(56) References Cited

U.S. PATENT DOCUMENTS

| 9,633,812 B1 * | 4/2017 | Senisi ............. H01J 19/78 |
| 2008/0218259 A1 | 9/2008 | Gallo |

(Continued)

FOREIGN PATENT DOCUMENTS

GB 2493029 1/2013

OTHER PUBLICATIONS

Notification of Transmittal of the International Search Report and the Written Opinion of the International Searching Authority, or the Declaration for corresponding International Application No. PCT/AU2019/000058, dated Jul. 31, 2019, 9 pages.

(Continued)

*Primary Examiner* — Daniel C Puentes
(74) *Attorney, Agent, or Firm* — Myers Bigel, P.A

(57) ABSTRACT

A method includes performing by a processor: estimating a total cathode space current for a thermionic vacuum tube having at least one grid and a plate, such that at least one amplification factor associated with the at least one grid is determined by a polynomial based on a variable that represents at plurality of voltages associated with the at least one grid and the plate, the variable being heuristically determine. Transitions between positive and negative grid operation may experience a step change in estimated current value caused by the inclusion or elimination of grid current. A part of the grid current may be added back into the plate current during transition. This small contribution to plate current may gradually diminish as tube operation moves farther away from the transition boundary.

20 Claims, 14 Drawing Sheets

(56) References Cited

U.S. PATENT DOCUMENTS

2011/0033057 A1    2/2011  Gallo
2013/0313980 A1*  11/2013  Cheatham, III ........ H01J 17/22
                                                        315/161

OTHER PUBLICATIONS

Radiotron Designer's Handbook, 4th ed., Amalgamated Wireless Valve Co., Sydney, Australia, 1963, pp. 70-71 and 82-84.
Herbert J. Reich, "Grid-Controlled High-Vacuum Tubes" in Theory and Applications of Electron Tubes, 2nd ed., New York: McGraw-Hill Book Co., 1944, ch. 3, sec. 3-1.
E. Leon Chaffee, "Emission of Electrons" in Theory of Termionic Vacuum Tubes, 1st ed., New York: McGraw-Hill Book Co, 1933, ch. IV, sec. 37, pp. 67-71.
W. Marshall Leach Jr., SPICE Models for Vacuum-Tube Amplifiers, J. Audio Eng. Soc. (Abstracts) (Mar. 1995), vol. 43, pp. 117-126.
Technical Manual-Sylvania Tubes, 10th ed., SYLVANIA, New York, 1955.
G.C. Cardarilli Marco Re and Leonardo Di Carlo, Improved Large-Signal Model for Vacuum Triodes, in IEEE International Symposium on Circuits and Systems (ISCAS), 2009, pp. 3006-3009.
Kristjan Dempwolf and Udo Zölzer, A Physically-Motivated Triode Model for Circuit Simulations, Proc. of the 14th International Conference on Digital Audio Effects, Paris, France, (Sep. 19-23, 2011), (DAFx-257-DAFx-264).
Karl R. Spangenburg, Vacuum Tubes, 1st ed., New York: McGraw-Hill Book Co, 1948, ch. 9, 11, pp. 224-225 and 272-273.
RCA Receiving Tube Manual, RCA, Harrison, NJ, 1968, pp. 545-553, 1996.
Philips Data Handbook—Electron tubes Part 4, Philips, Eindhoven, The Netherlands, 1972, (14 pages).
Intusoft, "Modeling Vacuum Tubes", Intusoft Newsletter, Feb. 1994, pp. 6-11).
Intusoft, "Modeling Vacuum tTubes, Part II", Intusoft Newsletter, Apr. 1994, pp. 7-11.

* cited by examiner

ESTIMATION OF CATHODE SPACE CURRENT FOR A THERMIONIC VACUUM TUBE USING A POLYNOMIAL BASED ON A HEURISTICALLY DETERMINED VARIABLE REPRESENTING THE GRID AND PLATE VOLTAGES

CROSS-REFERENCE TO RELATED APPLICATION

The present application claims priority to U.S. Provisional Patent Application Ser. No. 62/675,214, filed May 23, 2018, the entire content of which is incorporated by reference herein as if set forth in its entirety.

BACKGROUND

The present disclosure relates to thermionic vacuum tubes, and, in particular, to estimating total cathode space current in thermionic vacuum tubes.

Total space current in thermionic vacuum tubes has been modeled based on the Child-Langmuir three-halves-power law:

$$I_{sp} \approx G \cdot \left( (e_1 + \varepsilon) + \frac{e_2}{\mu_2} + \frac{e_3}{\mu_3} + \ldots + \frac{e_b}{\mu} \right)^{\frac{3}{2}} \quad (1)$$

where:
$I_{sp}$=total cathode space current
$G$=perveance, a constant related to tube geometry
$e_1$=voltage of the control (i.e. first) grid
$\varepsilon$=correction for initial velocity effects and contact potential on the first grid
$e_2, \ldots, e_n$=voltages of the successive outer grids
$\mu_2, \ldots, \mu_n$=amplification factors of first grid with respect to successive grids
$e_b$=voltage of the plate electrode
$\mu$=amplification factor of the first grid with respect to the plate The three-halves-power law equation was determined by making simplifying assumptions about tube geometry and electron physics and has been used in earlier SPICE models.

It has been seen; however, in published plate characteristic curves of real tubes that the perveance and amplification factor attributes in Equation (1) are not constant but may vary according to tube operating area i.e. they vary with electrode voltages $e_1, e_2, \ldots, e_b$.

For triode tubes, newer work makes improvements to handle such variabilities by using common mathematical approximation methods to fit polynomials to the tube properties appearing in Equation (1). Such work addresses the dependence on multiple electrode voltages by using multivariate polynomials. This may become increasingly complex with each additional electrode and the example of such work makes simplifying assumptions as to which electrode voltage is the most important so as to use univariate polynomials. The difficulty is that such assumptions are typically tested for every tube to be modelled and especially if this approach is found to be useful for tetrode or pentode tubes in the future.

Moreover, existing models are limited in determining the distribution of total cathode space current between grid current(s) and the plate current. For example, some models are inapplicable for plate current to grid current ratios of less than one.

SUMMARY

In some embodiments of the inventive concept, a method comprises, performing by a processor, estimating a total cathode space current for a thermionic vacuum tube having at least one grid and a plate, such that at least one amplification factor associated with the at least one grid is determined by a polynomial based on a variable that represents at plurality of voltages associated with the at least one grid and the plate, the variable being heuristically determined.

In other embodiments of the inventive concept, the polynomial is a univariate polynomial.

In other embodiments of the inventive concept, the at least one grid comprises a plurality of grids having a plurality of amplification factors associated therewith and wherein the variable $x(e_1, e_2, \ldots, e_b)$ is given as:

$$x(e_1, e_2, \ldots, e_b) = \frac{e_1 + \varepsilon}{\left( \frac{e_2}{\mu_2} + \frac{e_3}{\mu_3} + \ldots + \frac{e_b}{\mu} \right)}$$

wherein $\varepsilon$ is a correction constant for initial velocity effects and contact potential on a first one of the plurality of grids $e_1$; wherein $e_2, \ldots, e_n$ are the voltages associated with second through nth ones of the plurality of grids, respectively; wherein $\mu_2, \ldots, \mu_n$ are the plurality of amplification factors of the first one of the plurality of grids associated with the second through nth ones of the plurality of grids; wherein $e_b$ is the plate voltage; and wherein $\mu$ is an amplification factor associated with a first one of the plurality of grids with respect to the plate.

In other embodiments of the inventive concept, the plurality of amplification factors $\mu_k$ are given by $$\mu'_k(x) = \sum_{i=0}^{n} a_{k,i} \cdot \text{Min}(0, x(e_1, e_2, \ldots, e_b))^i$$

wherein $\alpha_{k,i}$ are fitting constants based on characteristics of the thermionic vacuum tube and k refers to an electrode; and wherein a respective amplification factor $\mu_k'$ is represented by the constant $\alpha_{k,0}$ when the associated grid carries a positive current thereon.

In other embodiments of the inventive concept, the at least one grid comprises a plurality of grids, the method further comprising determining a plurality of currents associated with the plurality of grids, respectively, based on a plurality of current ratios of the plurality of currents associated with the plurality of grids to a plate current.

In other embodiments of the inventive concept, the plurality of ratios is based on a plate voltage and the plurality of voltages associated with the plurality of grids, respectively.

In other embodiments of the inventive concept, the plurality of ratios $D_j$ are given by $$D_j \approx \left(1 + \frac{1}{25 r_j}\right)^{4 \cdot S\left(\frac{e_b}{e_j}\right)} \cdot \delta_j \cdot \left(\frac{e_b}{e_j}\right)^{r_j \cdot \left(1 + 3 \cdot S\left(\frac{e_b}{e_j}\right)\right)}$$

wherein $S(w)=e^{-w}$, $w>0$; ε wherein ε is a correction constant for initial velocity effects and contact potential on a first one of the plurality of grids $e_1$; wherein $e_j$=a control grid voltage $e_1+\varepsilon$ of the first one of the plurality of grids or a screen grid voltage $e_2$ of a second one of the plurality of grids; wherein $\delta_j$=current division factor, measured by a ratio of plate current to respective current associated with a respective one of the plurality of grids for equal plate and positive grid voltages; wherein $r_j$=grid dependent inverse power law; and wherein $e_b$ is the plate voltage.

In other embodiments of the inventive concept, the thermionic vacuum tube is a triode and $r_j=½$.

In other embodiments of the inventive concept, the thermionic vacuum tube is a tetrode or a pentode in the tetrode configuration and $r_j=⅕$.

In other embodiments of the inventive concept, the thermionic vacuum tube is a triode with one grid and the plate current $I_b$ is given by $$I_b = I_{sp} \cdot \left( \frac{1 + \frac{k_1}{D_1} \cdot T(e_1, e_b)}{1 + \frac{k_1}{D_1}} \right) \text{ wherein } k_1 = \begin{cases} 0, & (e_1+\varepsilon) \leq 0 \\ 1, & (e_1+\varepsilon) > 0 \end{cases}$$

$$T(e_1, e_b) = e^{\frac{-(e_1+\varepsilon)}{\left(\frac{e_b}{\mu}\right)}}, \quad (e_1+\varepsilon) > 0$$

wherein Isp is a total space current associated with the thermionic vacuum tube; wherein ε is a correction constant for initial velocity effects; wherein $e_b$ is the plate voltage; wherein $e_1$ is the grid voltage; wherein $D_1$ is a current ratio a grid to a plate current; and wherein μ is an amplification factor associated with the first one of the plurality of grids with respect to the plate In other embodiments of the inventive concept, the thermionic vacuum tube is a tetrode or pentode and the plate current $I_b$ is given by $$I_b = I_{sp} \cdot \left( \frac{1 + \frac{k_1}{D_1} \cdot T(e_1, e_b)}{1 + \frac{k_1}{D_1} + \frac{k_2}{D_2}} \right) \text{ wherein } k_1 = \begin{cases} 0, & (e_1+\varepsilon) \leq 0 \\ 1, & (e_1+\varepsilon) > 0 \end{cases} \text{ and}$$

$$k_2 = 1, e_2 > 0$$

$$T(e_1, e_b) = e^{\frac{-(e_1+\varepsilon)}{\left(\frac{e_b}{\mu_2}\right)}}, \quad (e_1+\varepsilon) > 0$$

wherein ε is a correction constant for initial velocity effects and contact potential on a first one of the plurality of grids $e_1$; wherein $\mu_2$ is the amplification factor of the first grid associated with the second one of the plurality of grids; and wherein μ is an amplification factor associated with the first one of the plurality of grids with respect to the plate.

In other embodiments of the inventive concept, the thermionic vacuum tube is a circuit element in a plurality of interconnected circuit elements, the method further comprising: using the estimate of the total cathode space current to determine an operational effect on at least one other one of the plurality of interconnected circuit elements.

In other embodiments of the inventive concept, the method further comprises receiving a digitized audio signal; and modifying the digitized audio signal based on the estimate of the total cathode space current.

In other embodiments of the inventive concept, the method further comprises converting the digitized audio signal that was modified to an analog signal.

In some embodiments of the inventive concept, a system comprises a processor and a memory coupled to the processor and comprising computer readable program code embodied in the memory that is executable by the processor to perform operations comprising: estimating a total cathode space current for a thermionic vacuum tube having at least one grid and a plate, such that at least one amplification factor associated with the at least one grid is determined by a polynomial based on a variable that represents at plurality of voltages associated with the at least one grid and the plate, the variable being heuristically determined.

In further embodiments of the inventive concept, the polynomial is a univariate polynomial.

In further embodiments of the inventive concept, the at least one grid comprises a plurality of grids having a plurality of amplification factors associated therewith and wherein the variable $x(e_1, e_2, \ldots, e_b)$ is given as:

$$x(e_1, e_2, \ldots, e_b) = \frac{e_1 + \varepsilon}{\left(\frac{e_2}{\mu_2} + \frac{e_3}{\mu_3} + \ldots + \frac{e_b}{\mu}\right)}$$

wherein ε is a correction constant for initial velocity effects and contact potential on a first one of the plurality of grids $e_1$; wherein $e_2, \ldots, \mu_n$ are the voltages associated with second through nth ones of the plurality of grids, respectively; wherein $\mu_2, \ldots, \mu_n$ are the plurality of amplification factors of the first one of the plurality of grids associated with the second through nth ones of the plurality of grids; wherein $e_b$ is the plate voltage; and wherein μ is an amplification factor associated with a first one of the plurality of grids with respect to the plate.

In further embodiments of the inventive concept, the plurality of amplification factors $\mu_k$ are given by $$\mu_k'(x) = \sum_{i=0}^{n} a_{k,i} \cdot \text{Min}(0, x(e_1, e_2, \ldots, e_b))^i$$

wherein $\alpha_{k,i}$ are fitting constants based on characteristics of the thermionic vacuum tube and k refers to an electrode; and wherein a respective amplification factor $\mu_k'$ is represented by the constant $\alpha_{k,0}$ when the associated grid carries a positive current thereon.

In further embodiments of the inventive concept, the at least one grid comprises a plurality of grids, the operations further comprising determining a plurality of currents associated with the plurality of grids, respectively, based on a plurality of current ratios of the plurality of currents associated with the plurality of grids to a plate current.

In further embodiments of the inventive concept, the plurality of ratios is based on a plate voltage and the plurality of voltages associated with the plurality of grids, respectively.

In further embodiments of the inventive concept, the plurality of ratios $D_j$ are given by $$D_j \approx \left(1 + \frac{1}{25 r_j}\right)^{4 \cdot S\left(\frac{e_b}{e_j}\right)} \cdot \delta_j \cdot \left(\frac{e_b}{e_j}\right)^{r_j \cdot \left(1 + 3 \cdot S\left(\frac{e_b}{e_j}\right)\right)}$$

wherein $S(w)=e^{-w}$, $w>0$; wherein $\varepsilon$ is a correction constant for initial velocity effects and contact potential on a first one of the plurality of grids $e_1$; wherein $e_j$=a control grid voltage $e_1+\varepsilon$ of the first one of the plurality of grids or a screen grid voltage $e_2$ of a second one of the plurality of grids; wherein $\delta_j$=current division factor, measured by a ratio of plate current to respective current associated with a respective one of the plurality of grids for equal plate and positive grid voltages; wherein $r_j$=grid dependent inverse power law; and wherein $e_b$ is the plate voltage.

In further embodiments of the inventive concept, the thermionic vacuum tube is a triode and $r_j=\frac{1}{2}$.

In further embodiments of the inventive concept, the thermionic vacuum tube is a tetrode or a pentode in the tetrode configuration and $r_j=\frac{1}{5}$.

In further embodiments of the inventive concept, the thermionic vacuum tube is a triode with one grid and the plate current $I_b$ is given by $$I_b = I_{sp} \cdot \left( \frac{1 + \frac{k_1}{D_1} \cdot T(e_1, e_b)}{1 + \frac{k_1}{D_1}} \right) \text{ wherein } k_1 = \begin{cases} 0, & (e_1+\varepsilon) \le 0 \\ 1, & (e_1+\varepsilon) > 0 \end{cases}$$

$$T(e_1, e_b) = e^{\frac{-(e_1+\varepsilon)}{\left(\frac{e_b}{\mu}\right)}}, (e_1+\varepsilon) > 0$$

wherein Isp is a total space current associated with the thermionic vacuum tube; wherein $\varepsilon$ is a correction constant for initial velocity effects; wherein $e_b$ is the plate voltage; wherein $e_1$ is the grid voltage; wherein $D_1$ is a current ratio a grid to a plate current; and wherein $\mu$ is an amplification factor associated with the first one of the plurality of grids with respect to the plate In further embodiments of the inventive concept, the thermionic vacuum tube is a tetrode or pentode and the plate current $I_b$ is given by $$I_b = I_{sp} \cdot \left( \frac{1 + \frac{k_1}{D_1} \cdot T(e_1, e_b)}{1 + \frac{k_1}{D_1} + \frac{k_2}{D_2}} \right) \text{ wherein } k_1 = \begin{cases} 0, & (e_1+\varepsilon) \le 0 \\ 1, & (e_1+\varepsilon) > 0 \end{cases} \text{ and}$$

$$k_2 = 1, e_2 > 0$$

$$T(e_1, e_b) = e^{\frac{-(e_1+\varepsilon)}{\left(\frac{e_b}{\mu_2}\right)}}, (e_1+\varepsilon) > 0$$

wherein $\varepsilon$ is a correction constant for initial velocity effects and contact potential on a first one of the plurality of grids $e_1$; wherein $\mu_2$ is the amplification factor of the first grid associated with the second one of the plurality of grids; and wherein $\mu$ is an amplification factor associated with the first one of the plurality of grids with respect to the plate.

In further embodiments of the inventive concept, the thermionic vacuum tube is a circuit element in a plurality of interconnected circuit elements, the operations further comprising: using the estimate of the total cathode space current to determine an operational effect on at least one other one of the plurality of interconnected circuit elements.

In further embodiments of the inventive concept, the operations further comprise receiving a digitized audio signal; and modifying the digitized audio signal based on the estimate of the total cathode space current.

In further embodiments of the inventive concept, the operations further comprise converting the digitized audio signal that was modified to an analog signal.

In some embodiments of the inventive concept, a computer program product comprises a tangible computer readable storage medium comprising computer readable program code embodied in the medium that when executed by a processor causes the processor to perform operations comprising: estimating a total cathode space current for a thermionic vacuum tube having at least one grid and a plate, such that at least one amplification factor associated with the at least one grid is determined by a polynomial based on a variable that represents at plurality of voltages associated with the at least one grid and the plate, the variable being heuristically determined.

In other embodiments of the inventive concept, the polynomial is a univariate polynomial.

In other embodiments of the inventive concept, the at least one grid comprises a plurality of grids having a plurality of amplification factors associated therewith and wherein the variable $x(e_1, e_2, \ldots, e_b)$ is given as:

$$x(e_1, e_2, \ldots, e_b) = \frac{e_1+\varepsilon}{\left(\frac{e_2}{\mu_2} + \frac{e_3}{\mu_3} + \ldots + \frac{e_b}{\mu}\right)}$$

wherein $\varepsilon$ is a correction constant for initial velocity effects and contact potential on a first one of the plurality of grids $e_1$; wherein $e_2, \ldots, e_n$ are the voltages associated with second through nth ones of the plurality of grids, respectively; wherein $\mu_2, \ldots, \mu_n$ are the plurality of amplification factors of the first one of the plurality of grids associated with the second through nth ones of the plurality of grids; wherein $e_b$ is the plate voltage; and wherein $\mu$ is an amplification factor associated with a first one of the plurality of grids with respect to the plate.

In other embodiments of the inventive concept, the plurality of amplification factors $\mu_k$ are given by $$\mu'_k(x) = \sum_{i=0}^{n} a_{k,i} \cdot \text{Min}(0, x(e_1, e_2, \ldots, e_b))^i$$

wherein $\alpha_{k,i}$ are fitting constants based on characteristics of the thermionic vacuum tube and k refers to an electrode; and wherein a respective amplification factor $\mu_k'$ is represented by the constant $\alpha_{k,0}$ when the associated grid carries a positive current thereon.

In other embodiments of the inventive concept, the at least one grid comprises a plurality of grids, the operations further comprising determining a plurality of currents associated with the plurality of grids, respectively, based on a plurality of current ratios of the plurality of currents associated with the plurality of grids to a plate current.

In other embodiments of the inventive concept, the plurality of ratios is based on a plate voltage and the plurality of voltages associated with the plurality of grids, respectively.

In other embodiments of the inventive concept, the plurality of ratios $D_j$ are given by $$D_j \approx \left(1 + \frac{1}{25r_j}\right)^{4 \cdot S\left(\frac{e_b}{e_j}\right)} \cdot \delta_j \cdot \left(\frac{e_b}{e_j}\right)^{r_j \cdot \left(1 + 3 \cdot S\left(\frac{e_b}{e_j}\right)\right)}$$

wherein $s(w)=e^{-w}$, $w>0$; wherein $\varepsilon$ is a correction constant for initial velocity effects and contact potential on a first one of the plurality of grids $e_1$; wherein $e_j$=a control grid voltage $e_1+\varepsilon$ of the first one of the plurality of grids or a screen grid voltage $e_2$ of a second one of the plurality of grids; wherein $\delta_j$=current division factor, measured by a ratio of plate current to respective current associated with a respective one of the plurality of grids for equal plate and positive grid voltages; wherein $r_j$=grid dependent inverse power law; and wherein $e_b$ is the plate voltage.

In other embodiments of the inventive concept, the thermionic vacuum tube is a triode and $r_j=\frac{1}{2}$.

In other embodiments of the inventive concept, the thermionic vacuum tube is a tetrode or a pentode in the tetrode configuration and $r_j=\frac{1}{5}$.

In further embodiments of the inventive concept, the thermionic vacuum tube is a triode with one grid and the plate current $I_b$ is given by $$I_b = I_{sp} \cdot \left( \frac{1 + \frac{k_1}{D_1} \cdot T(e_1, e_b)}{1 + \frac{k_1}{D_1}} \right) \text{ wherein } k_1 = \begin{cases} 0, & (e_1+\varepsilon) \leq 0 \\ 1, & (e_1+\varepsilon) > 0 \end{cases}$$

$$T(e_1, e_b) = e^{\frac{-(e_1+\varepsilon)}{\left(\frac{e_b}{\mu}\right)}}, (e_1+\varepsilon) > 0$$

wherein Isp is a total space current associated with the thermionic vacuum tube; wherein $\varepsilon$ is a correction constant for initial velocity effects; wherein $e_b$ is the plate voltage; wherein $e_1$ is the grid voltage; wherein $D_1$ is a current ratio a grid to a plate current; and wherein $\mu$ is an amplification factor associated with the first one of the plurality of grids with respect to the plate In other embodiments of the inventive concept, the thermionic vacuum tube is a tetrode or pentode and the plate current $I_b$ is given by $$I_b = I_{sp} \cdot \left( \frac{1 + \frac{k_1}{D_1} \cdot T(e_1, e_b)}{1 + \frac{k_1}{D_1} + \frac{k_2}{D_2}} \right) \text{ wherein } k_1 = \begin{cases} 0, & (e_1+\varepsilon) \leq 0 \\ 1, & (e_1+\varepsilon) > 0 \end{cases} \text{ and }$$

$$k_2 = 1, e_2 > 0$$

$$T(e_1, e_b) = e^{\frac{-(e_1+\varepsilon)}{\left(\frac{e_b}{\mu_2}\right)}}, (e_1+\varepsilon) > 0$$

wherein $\varepsilon$ is a correction constant for initial velocity effects and contact potential on a first one of the plurality of grids $e_1$; wherein $\mu_2$ is the amplification factor of the first grid associated with the second one of the plurality of grids; and wherein $\mu$ is an amplification factor associated with the first one of the plurality of grids with respect to the plate.

In other embodiments of the inventive concept, the thermionic vacuum tube is a circuit element in a plurality of interconnected circuit elements, the operations further comprising: using the estimate of the total cathode space current to determine an operational effect on at least one other one of the plurality of interconnected circuit elements.

In other embodiments of the inventive concept, the operations further comprise receiving a digitized audio signal; and modifying the digitized audio signal based on the estimate of the total cathode space current.

In other embodiments of the inventive concept, the operations further comprise converting the digitized audio signal that was modified to an analog signal.

Other methods, systems, articles of manufacture, and/or computer program products, according to embodiments of the inventive subject matter, will be or become apparent to one with skill in the art upon review of the following drawings and detailed description. It is intended that all such additional systems, methods, articles of manufacture, and/or computer program products be included within this description, be within the scope of the present inventive subject matter, and be protected by the accompanying claims.

BRIEF DESCRIPTION OF THE DRAWINGS

Other features of embodiments will be more readily understood from the following detailed description of specific embodiments thereof when read in conjunction with the accompanying drawings, in which.

DETAILED DESCRIPTION

Figure 1:
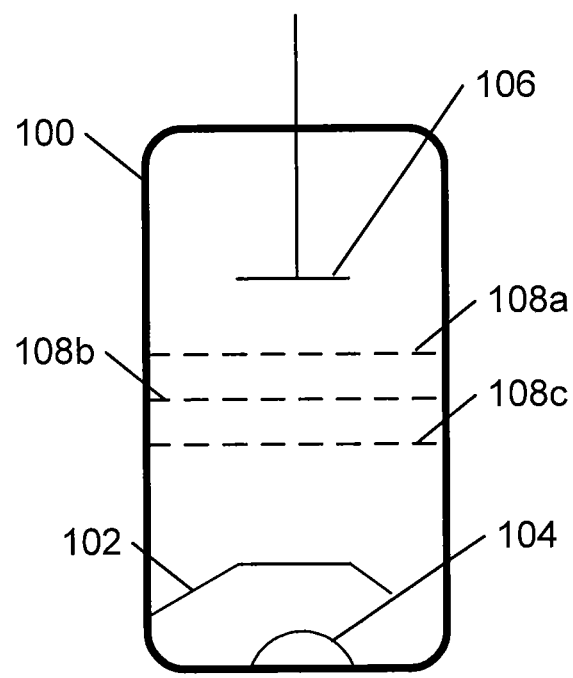
FIG. 1 is a circuit diagram of a thermionic vacuum tube whose operation can be simulated and/or estimated according to some embodiments of the inventive concept.

In the following detailed description, numerous specific details are set forth to provide a thorough understanding of embodiments of the present disclosure. However, it will be understood by those skilled in the art that the present invention may be practiced without these specific details. In some instances, well-known methods, procedures, components and circuits have not been described in detail so as not to obscure the present disclosure. It is intended that all embodiments disclosed herein can be implemented separately or combined in any way and/or combination. Aspects described with respect to one embodiment may be incorporated in different embodiments although not specifically described relative thereto. That is, all embodiments and/or features of any embodiments can be combined in any way and/or combination.

As used herein, the term "data processing facility" includes, but it is not limited to, a hardware element, firmware component, and/or software component. A data processing system may be configured with one or more data processing facilities.

Some embodiments of the inventive subject matter may stem from a realization that estimating a total cathode space current for a thermionic vacuum tube, according to some embodiments of the inventive concept, uses a polynomial fitted to an amplification factor. In some embodiments, the polynomial is a univariate polynomial, but uses a heuristic function for the polynomial variable so all grid electrode voltages may influence the value returned. This may result in increased accuracy and obviate the need for multivariate polynomial approximation.

In some embodiments, other tube properties, such as perveance and the contact potential/initial velocity corrections, may remain constants. Maintaining a constant for the value of perveance addresses the realization that it may not have large excursion.

In the determination of total space current, using polynomial approximation for only one tube property may make it easier to adjust the values of all properties to improve overall accuracy.

The terms in Equation (1) sum to produce an equivalent electrode voltage for a diode whose effective plate is positioned at the first grid. According to some embodiments of the inventive concept for the triode and tetrode models described herein, the ratio of voltage on the control grid to the sum of the equivalent diode electrode voltage contributions for electrodes beyond the control grid may be useful as the variable of polynomials used to approximate tube amplification.

With regard to the current flow through a tube's positive grid electrodes the traditional method for its determination involves the following empirical current division equations:

$$D_{triode} = \frac{I_b}{I_1} \approx \begin{cases} \delta \cdot \left(\frac{e_b}{e_1}\right)^{\frac{1}{2}}, & e_b \geq 0.8e_1 \\ 1.392 \cdot \delta \cdot \left(\frac{e_b}{e_1}\right)^2, & e_b \leq 0.8e_1 \end{cases} \quad (2)$$

$$D_{pentode} = \frac{I_b}{I_2} \approx \delta \cdot \left(\frac{e_b}{e_2}\right)^{\frac{1}{5}} \quad (3)$$

where:
$I_b$=the current flow through the plate electrode
$I_1$=current flow through the control (i.e. $1^{st}$) grid
$I_2$=current flow through the screen (i.e. $2^{nd}$) grid
$\delta$=current division factor, measured by the ratio of plate to grid current for equal plate and positive grid voltages
$e_1$=voltage at the triode control (i.e., first) grid
$e_2$=voltage at the pentode screen (i.e, second) grid Some embodiments of the inventive concept described herein may combine the effect of the above equations into one heuristic and extend accuracy of pentode current division for the range $e_b \leq 0.259e_2$. The diminished accuracy of Equation (3) in this range may be seen in published information for the 6V7 tube.

When tube operation moves between positive and negative control grid regions, plate current may experience a numerical discontinuity. This may adversely affect calculation of derivative based properties, such as voltage gain, mutual conductance and plate resistance in the transition region. According to some embodiments of the inventive concept, discontinuity may be reduced or eliminated by use of a smoothing technique.

Referring to FIG. 1, a thermionic vacuum tube 100, whose operation can be simulated or estimated, according to some embodiments of the inventive concept, is illustrated. Thermionic vacuum tube technology is based on the concept of thermionic emission. Thermionic emission refers to the phenomenon that when an electrode is heated in a vacuum it will emit electrons. The electrons would normally remain in the vicinity of the heated electrode; however, if another electrode is placed into the vacuum and a positive potential is applied to the electrode, then the electrons emitted from the heated electrode will be drawn towards the element with the positive potential resulting in current flow. Other electrodes, which are referred to as grid electrodes, may also be placed into the vacuum between the heated electrode (referred to as a cathode) and the electrode with the positive potential (referred to as the anode or plate) to control the current between the cathode and plate. Thus, as shown in FIG. 1, the thermionic vacuum tube 100 comprises the following electrodes: a cathode 102 that is configured to be heated by the heater 104, an anode or plate 106, and one or more grids 108a, 108b, and 108c. The cathode 102 may be configured to emit electrons responsive to heat from the heater 104. The heater 104 may comprise a filament that may directly or indirectly heat the cathode 102. In early vacuum tubes, cathodes were directly heated; however, most vacuum tubes today are indirectly heated as it allows the cathode 102 to operate at a potential higher than a ground or reference voltage. The anode or plate 106 may be configured to operate at a relatively high potential to attract electrons from the cathode 102. The grid electrodes 108a, 108b, and/or 108c may be configured to operate at variable potentials to control the flow of electrons between the cathode 102 and the anode or plate 106. The number of grid electrodes 108a, 108b, and/or 108c may be use to configure the operation of the vacuum tube for a particular application. For example, when no grid electrodes 108a, 108b, and 108c are used, then the vacuum tube 100 may operate as a diode such that current can only pass one way through the device. The vacuum tube 100 may be configured in this manner for operation as a rectifier, for example. When a single grid electrode 108b is used, this configuration may be called a triode configuration and the single grid electrode 108b may be used to control the flow of electrons between the cathode 104 and the anode or plate 106. When a fourth electrode is added 108a, then this configuration may be called a tetrode configuration and the fourth electrode 108a may be called a screen grid. The fourth electrode 108a is typically held at a relatively high potential, but lower than that of the anode or plate 106. When a fifth electrode is added 108c, then this configuration may be called a pentode configuration and the fifth electrode 108c may be called a suppressor grid. The fifth electrode 108c is typically held at a relatively low potential to suppress secondary emission.

Although FIG. 1 illustrates an example thermionic vacuum tube 100 whose operations can be estimated or simulated, it will be understood that embodiments of the inventive concept are not limited to such configurations, but are intended to encompass any configuration whose operations can be estimated or simulated in accordance with the operations described herein.

Figure 2:
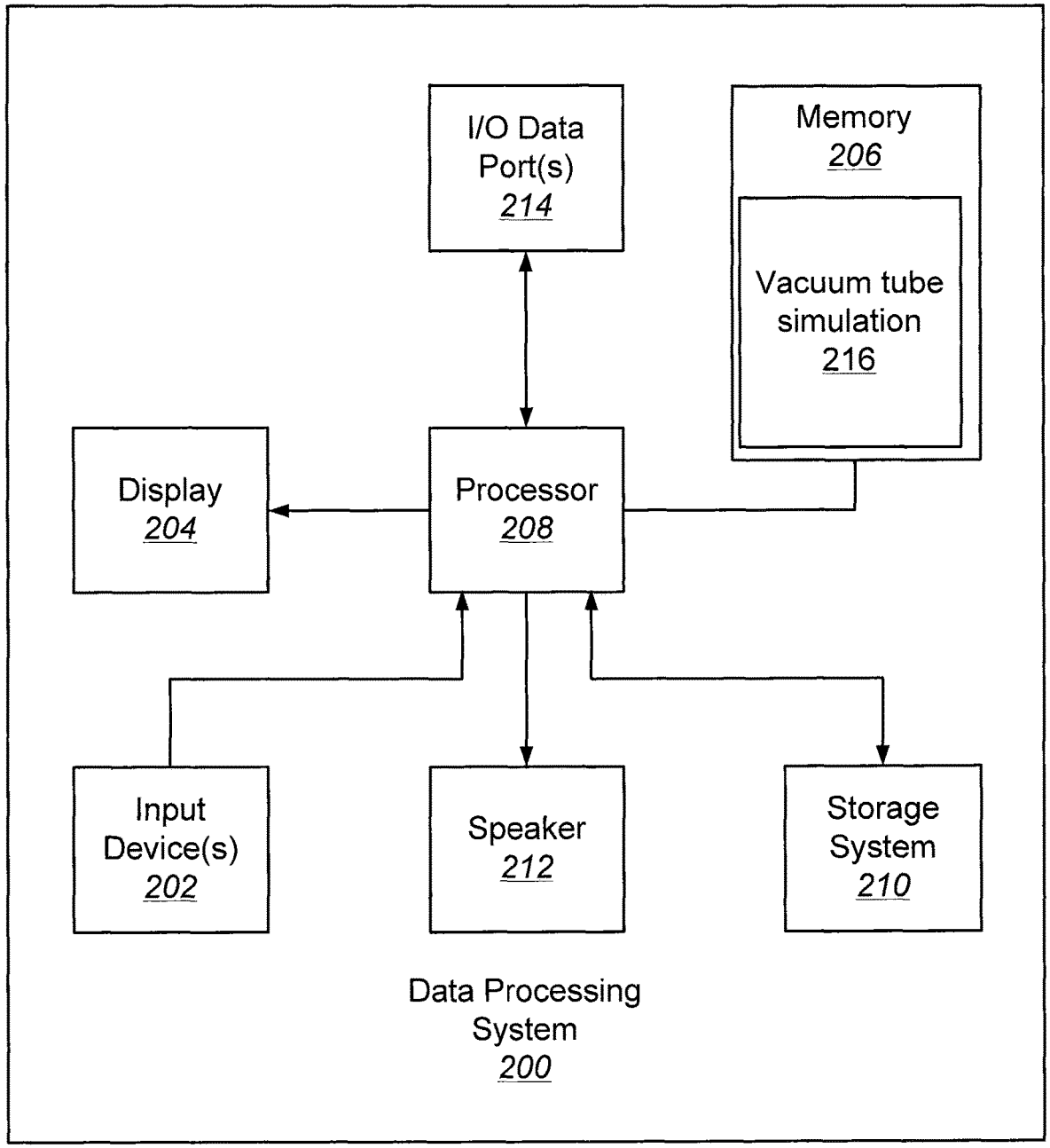
FIG. 2 illustrates a data processing system that may be used to estimate and/or simulate thermionic vacuum tube operations according to some embodiments of the inventive concept.

Referring now to FIG. 2, a data processing system 200 that may be used to estimate and/or simulate thermionic vacuum tube operations, such as operations of the thermionic vacuum tube 100 of FIG. 1, in accordance with some embodiments of the inventive concept, comprises input device(s) 202, such as a keyboard or keypad, a display 204, and a memory 206 that communicate with a processor 208. The data processing system 200 may further include a storage system 210, a speaker 212, and an input/output (I/O) data port(s) 214 that also communicate with the processor 208. The storage system 210 may include removable and/or fixed media, such as floppy disks, ZIP drives, hard disks, USB flash storage, or the like, as well as virtual storage, such as a RAMDISK. The I/O data port(s) 214 may be used to transfer information between the data processing system 200 and another computer system or a network (e.g., the Internet). These components may be conventional components, such as those used in many conventional computing devices, and their functionality, with respect to conventional operations, is generally known to those skilled in the art. The memory 206 may be configured with a vacuum tube simulation module 216 that may provide functionality that may include, but is not limited to, simulating and/or estimating operations of a thermionic vacuum tube, such as the thermionic vacuum tube 100 of FIG. 1, in accordance with some embodiments of the inventive subject matter.

Figure 3:
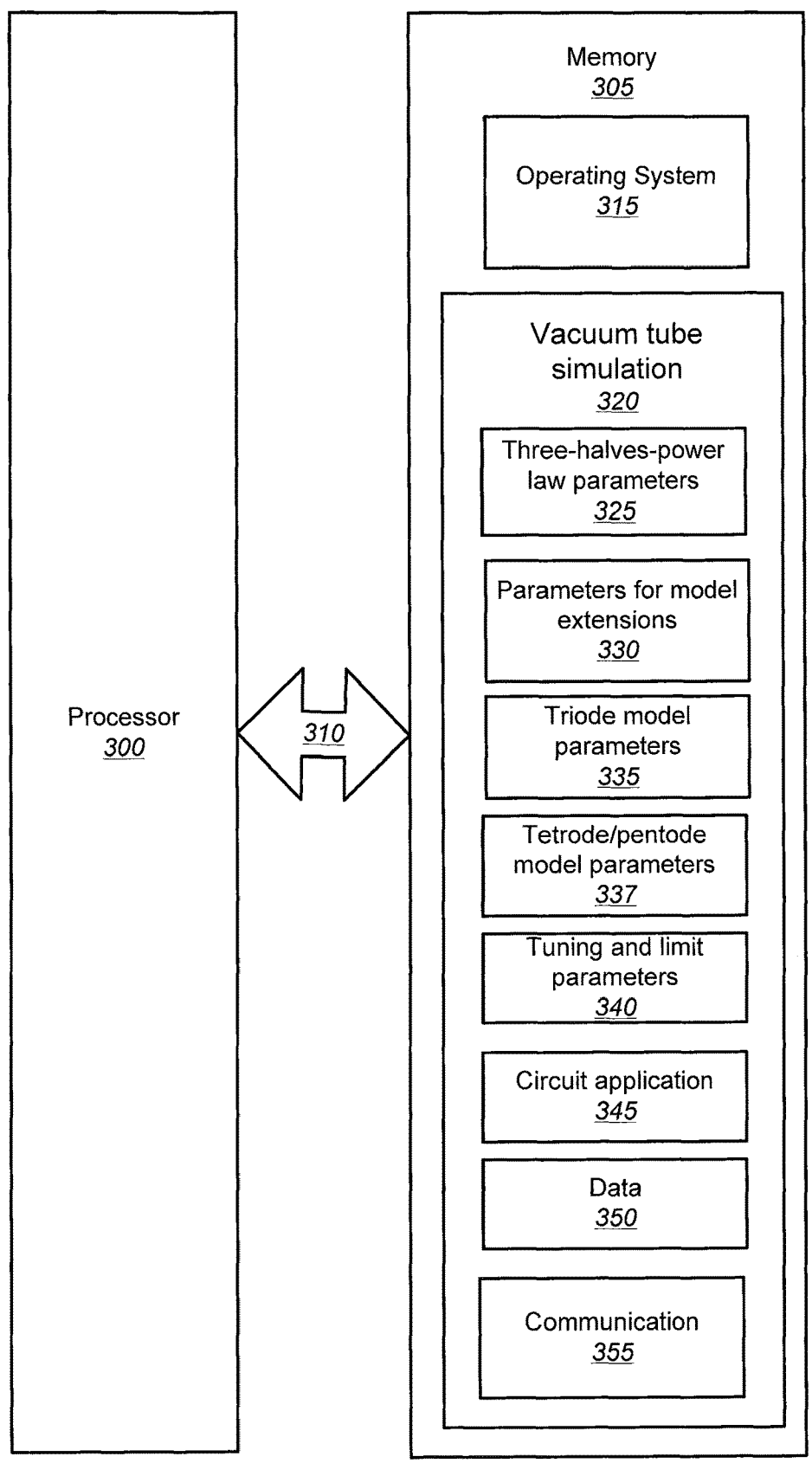
FIG. 3 is a block diagram that illustrates a software/hardware architecture for estimating and/or simulating thermionic vacuum tube operations according to some embodiments of the inventive concept.

FIG. 3 illustrates a processor 300 and memory 305 that may be used in embodiments of data processing systems, such as the data processing system 200 of FIG. 2, for simulating and/or estimating operations of a thermionic vacuum tube, such as the thermionic vacuum tube 100 of FIG. 1, in accordance with some embodiments of the inventive subject matter. The processor 300 communicates with the memory 305 via an address/data bus 310. The processor 300 may be, for example, a commercially available or custom microprocessor. The memory 305 is representative of the one or more memory devices containing the software and data used f for simulating and/or estimating operations of a thermionic vacuum tube in accordance with some embodiments of the inventive subject matter. The memory 305 may include, but is not limited to, the following types of devices: cache, ROM, PROM, EPROM, EEPROM, flash, SRAM, and DRAM.

As shown in FIG. 3, the memory 305 may contain two or more categories of software and/or data: an operating system 315 and a vacuum tube simulation module 320. In particular, the operating system 315 may manage the data processing system's software and/or hardware resources and may coordinate execution of programs by the processor 300. The vacuum tube simulation module 320 may comprise a three-halves-power law parameters module 325, an extensions to multi-grid model parameters module 330, a triode model parameters module 335, a tetrode/pentode model parameters module 337, a tuning and limit parameters module 340, a circuit application module 345, a data module 350, and a communication module 355.

The three-halves-power law parameters module 325 may be configured to receive and process values for parameters used in the Child-Langmuir three-halves-power law model for determining the total space current in a thermionic vacuum tube. These parameters may include the perveance, a correction value for initial velocity effects and contact potential on the first grid, and the amplification factor of the first grid to the remaining grids or with respect to the anode or plate.

The parameters for model extensions module 330 may be configured to determine or generate extensions Child-Langmuir three-halves-power law model including, but not limited to, generating a polynomial based on a variable that represents a plurality of voltages associated with the anode or plate and one or more grid electrodes, fitting the polynomial to amplification factor(s) for the grid electrode(s), determining a total space current for the vacuum tube based on the amplification factor(s), determining a current division between the total cathode space current and the individual grid electrode(s), and determining the electrode current(s) based on the current division.

The triode model parameters module 335 and the tetrode/pentode model parameters module 337 may be configured to determine or generate total cathode space current and electrode currents for specific tetrode/pentode thermionic vacuum tube configurations including smoothing the discontinuity due to a step change in current that may occur on a transition between a positive and negative potential on a grid electrode. In some embodiments, the smoothing may be performed by adding a portion of the grid current back into the plate current during the transition.

The turning and limit parameters module 340 may be configured to receive and modify the determinations made by the extensions to multi-grid model parameters module 330 the triode model parameters module 335 and the tetrode/pentode model parameters module 337 to tune the determinations and/or estimations to specific thermionic vacuum tube implementations and to avoid errors that may occur when the parameter values used in the aforementioned modules are outside of expected operating ranges, for example.

The circuit application module 345 may be configured to use the estimations of total cathode space current, grid currents, and anode or plate current to simulate one or more operations of a thermionic vacuum tube, such as the thermionic vacuum tube of FIG. 1, in a circuit including the effect on other circuit elements, and/or to process digital signals, such as a digitized audio signal, based on the aforementioned current estimations, by, for example, modifying a digitized audio signal and generating an audio signal therefrom.

The data module 350 may represent values for the various parameters used in the estimation and/or simulation of operations of a thermionic vacuum tube in accordance with the embodiments described herein.

The communication module 355 may be configured to facilitate communication between as user and/or another electronic device for supplying input data for the various parameters used in the estimation and/or simulation of operations of a thermionic vacuum tube in accordance with the embodiments described herein and in communicating the determined currents and/or other operational effects, such as in a circuit simulation or signal processing application, to a user or other device for display and/or storage.

Although FIG. 3 illustrates hardware/software architectures that may be used in data processing systems, such as data processing system 200 of FIG. 2, for estimating and/or simulating thermionic vacuum tube operations, in accordance with some embodiments of the inventive concept, it will be understood that embodiments of the present invention is not limited to such a configuration but is intended to encompass any configuration capable of carrying out operations described herein.

Computer program code for carrying out operations of data processing systems discussed above with respect to FIGS. 2-3 may be written in a high-level programming language, such as Python, Java, C, and/or C++, for development convenience. In addition, computer program code for carrying out operations of the present invention may also be written in other programming languages, such as, but not limited to, interpreted languages. Some modules or routines may be written in assembly language or even micro-code to enhance performance and/or memory usage. It will be further appreciated that the functionality of any or all of the program modules may also be implemented using discrete hardware components, one or more application specific integrated circuits (ASICs), or a programmed digital signal processor or microcontroller.

Moreover, the functionality of the data processing system 200 of FIG. 2 and the hardware/software architecture of FIG. 3 may each be implemented as a single processor system, a multi-processor system, a multi-core processor system, or even a network of stand-alone computer systems, in accordance with various embodiments of the inventive subject matter. Each of these processor/computer systems may be referred to as a "processor" or "data processing system."

The data processing apparatus of FIGS. 2-3 may be used to facilitate the estimation and/or simulation of thermionic vacuum tube operations, according to various embodiments described herein. These apparatus may be embodied as one or more enterprise, application, personal, pervasive and/or embedded computer systems and/or apparatus that are operable to receive, transmit, process and store data using any suitable combination of software, firmware and/or hardware and that may be standalone or interconnected by any public and/or private, real and/or virtual, wired and/or wireless network including all or a portion of the global communication network known as the Internet, and may include various types of tangible, non-transitory computer readable media. In particular, the memory 206 coupled to the processor 208 and the memory 305 coupled to the processor 300 include computer readable program code, such as the vacuum tube simulation module 320, that, when executed by the respective processors, causes the respective processors to perform one or more operations including one or more of the operations described herein with respect to FIGS. 4-22.

Figure 4:
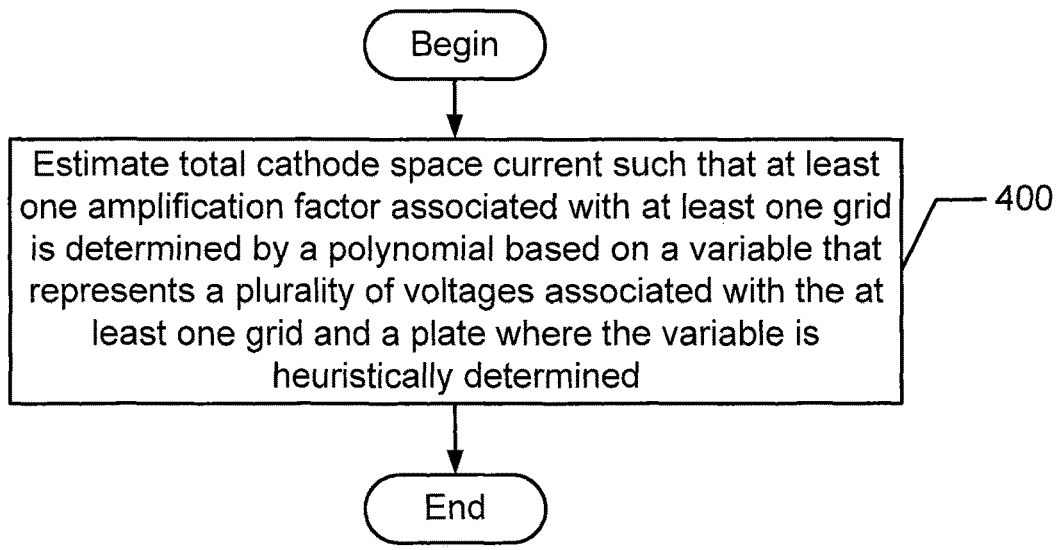
FIGS. 4-8 are flowcharts that illustrate operations for estimating and/or simulating thermionic vacuum tube operations according to some embodiments of the inventive concept.

FIG. 4 is a flowchart that illustrates operations for estimating and/or simulating thermionic vacuum tube operations according to some embodiments of the inventive concept. Operations begin at block 400 where the vacuum tube simulation module 320 executing on the processor 300, for example, estimates the total cathode space current, such that at least one amplification factor associated with at least one grid is determined by a polynomial based on a variable that represents a plurality of voltages associated with the at least one grid and an anode or plate where the polynomial is heuristically determined.

Figure 5:
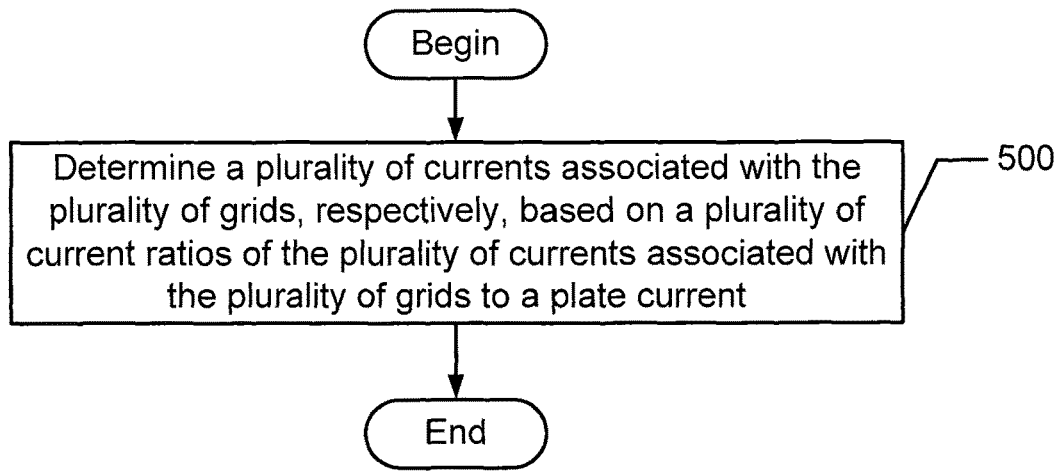

FIG. 5 is a flowchart that illustrates further operations for estimating and/or simulating thermionic vacuum tube operations according to some embodiments of the inventive concept. In the embodiments of FIG. 5, the plate current is estimated by taking into account the effect of the grid electrodes by determining a plurality of currents associated with a plurality of grids, respectively, based on a plurality of current ratios of the plurality of currents associated with the plurality of grids to an anode or plate current.

Figure 6:
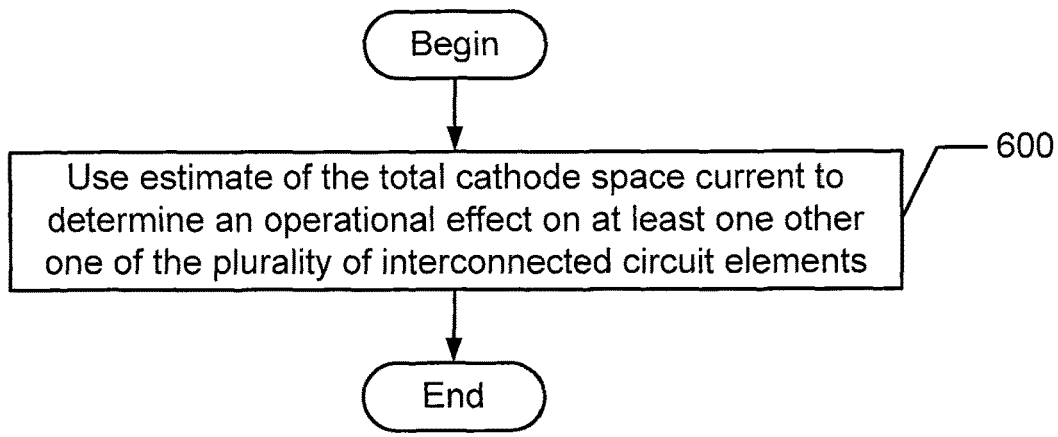
Figure 7:
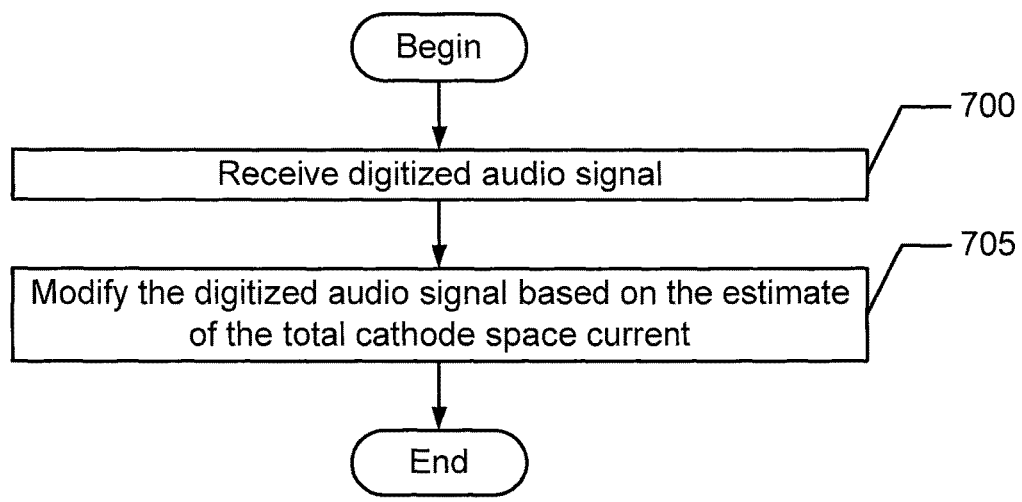

FIGS. 6 and 7 are flowcharts that illustrate applications for estimating and/or simulating thermionic vacuum tube operations according to some embodiments of the inventive concept. Referring to FIG. 6, operations begin at block 600 where the estimate of the total cathode space current and/or grid currents, anode or plate currents, or other tube characteristics, is used to determine an operational effect on at least one other of a plurality of interconnected circuit elements. Estimating and/or simulating vacuum tube operations can be used in signal processing applications. For example, referring to FIG. 7, operations begin at block 700 where a digitized audio signal is received. The digitized audio signal is modified at block 705 based on an estimate of the total cathode space current. In some embodiments, an audio signal may be generated from the modified digitized audio signal for use, for example, in an audio signal processing device, such as an amplifier.

Figure 8:
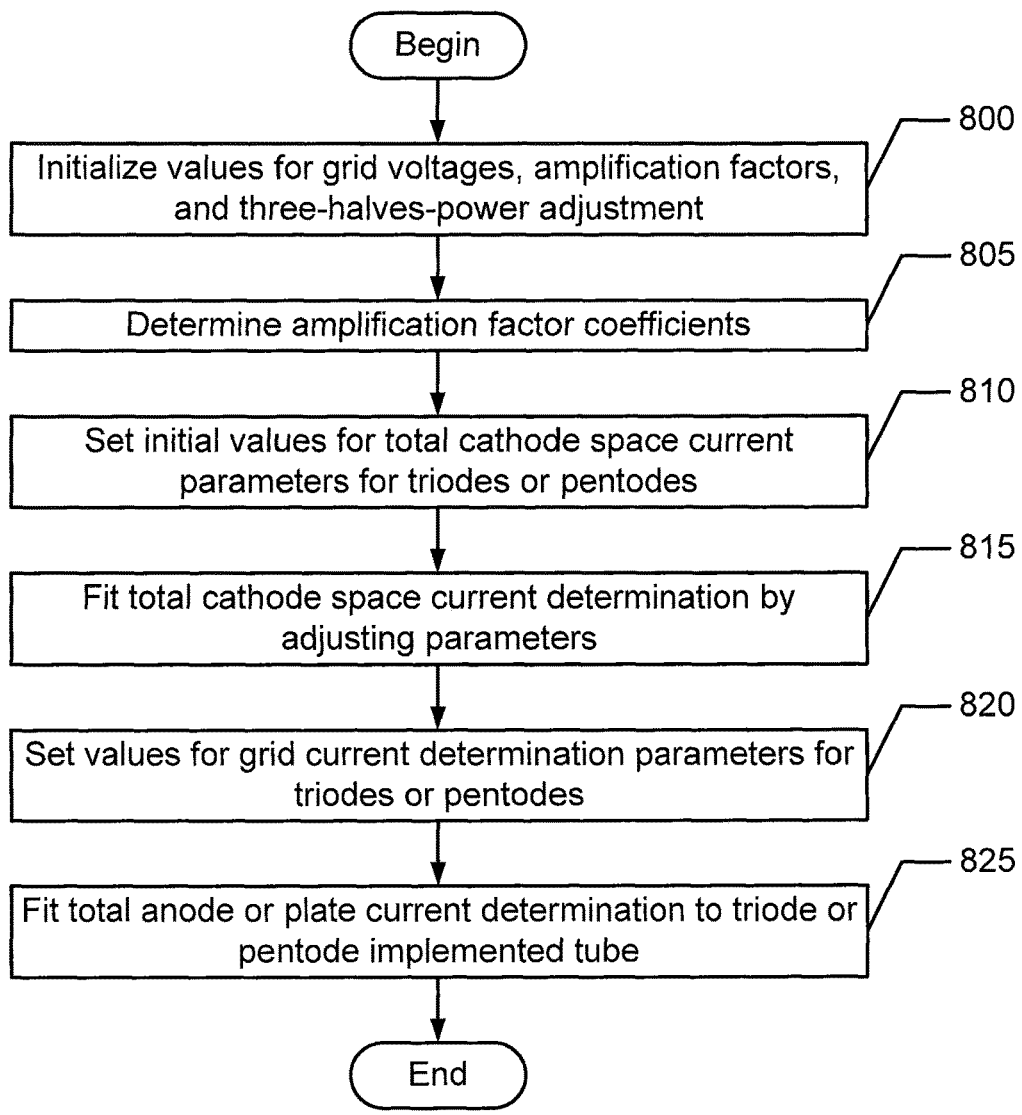

Determining the thermionic vacuum tube parameters may be iterative as certain parameters may need to be adjusted to reflect differences between theoretical performance and actual performance. FIG. 8 is a flowchart that illustrates this iterative process for estimating and/or simulating thermionic vacuum tube operations according to some embodiments of the inventive concept. Operations begin at block 800 where values for grid voltages, amplification factors, and three-halves-power adjustment are initialized. Amplification factor coefficients for the grid electrodes are determined at block 805. Values for total cathode space current are initialized at block 810. The total cathode space current determination is fit for triode and/or pentode applications at block 815. Values for grid current determination parameters are set for triode and/or pentode applications at block 820. The total anode or plate current determination is fit for triode and/or pentode applications at block 825.

Embodiments of the inventive subject matter may be illustrated by way of example. Further embodiments of the modules comprising the vacuum tube simulation module 320 of FIG. 3 will be described hereafter along with examples of the estimations and/or simulations for actual thermionic vacuum tubes.

The thermionic vacuum tube model, according to some embodiments of the inventive concept, may be governed by processes executed by the extensions to multi-grid model parameters module 330. These processes/determinations may include, but are not limited to the following:
The polynomial variable
Amplification factor
Total space current
Current division
Electrode currents Methods and processes for determining these parameters, according to some embodiments of the inventive concept, are described below.

The Polynomial Variable

Below is a function for the polynomial variable:

$$x(e_1, e_2, \ldots, e_b) = \frac{e_1 + \varepsilon}{\left(\frac{e_2}{\mu_2} + \frac{e_3}{\mu_3} + \ldots + \frac{e_b}{\mu}\right)} \quad (4)$$

Note that the denominator of Equation (4) is never negative. This is because a limitation of Equation (1) and of its associated form herein is that it does not support formation of virtual cathodes beyond the control grid. This means that the sign $x(e_1, e_2, \ldots, e_b)$ is determined by the sign of the numerator only i.e. the corrected control grid voltage.

This feature may be used to select alternative actions when the tube is operating with positive grid current and when it is not.

Some benefits for polynomials using this variable may include, but are not limited to the following:

They can be univariate but all electrodes may still influence the fitted property.

The polynomial variable may be unit-less so physical units may be determined by the units of the polynomial coefficients. This may preserve the physical integrity of the tube property the polynomial represents.

The coefficient of the $0^{th}$ power term may be interpreted as the value of the fitted tube property when a tube is operating in self bias mode.

Amplification Factor

The model presented here, according to some embodiments of the inventive concept, may use a polynomial fitted to the amplification factor. That is:

$$\mu'_k(x) = \sum_{i=0}^{n} a_{k,i} \cdot \text{Min}(0, x(e_1, e_2, \ldots, e_b))^i \quad (5)$$

Where:

$\alpha_{k,i}$ are fitting constants based on characteristics of the thermionic vacuum tube;

k, refers to the electrode acting as a plate;

wherein a respective amplification factor $\mu_k'$ is represented by the constant $\alpha_{k,0}$ when the associated grid carries a positive current thereon.

In subsequent equations for simplicity, the subscript $_k$ may be absent from the polynomial coefficients $\alpha_{k,i}$ and/or the dependent variable $\mu_k'$ when the electrode it refers to is implicitly known from context.

Note that the Min function may have the effect of invoking polynomial approximation only when there is no control grid current. Otherwise Equation (5) returns the coefficient of the $0^{th}$ power term .i.e. a constant amplification factor for positive grid operation.

Even though Equation (5) is not intended to model the variation of amplification factor for positive grid operation, the actual amplification factor experienced when using it in the model does show the expected reduction in amplification factor with increasing positive grid operation (just as it does for increasingly negative grid operation). This occurs because positive grid operation may divert some space current to the control grid and away from the plate, which reduces the amplification factor in this region.

Total Space Current

When the polynomial function which is fitted to the amplification factors and substituted into Equation (1) the expression for total space current becomes:

$$I_{sp} \approx G \cdot \left( (e_1 + \varepsilon) + \frac{e_2}{\mu_2'(x)} + \frac{e_3}{\mu_3'(x)} + \ldots + \frac{e_b}{\mu'(x)} \right)^{\frac{3}{2}} \quad (6)$$

Where:

Current Division

To generalize the current division method one may consider the equations $D_j$ that provide the results for the following current divisions:

$$\frac{I_b}{I_j} = D_j(e_j, e_b) \quad (7)$$

Where:

$I_j$=the current through grid electrode j when $e_j>0$

No simple, analytical form for functions $D_j(e_1, e_2, \ldots, e_b)$ is known. What are available are the tube type specific, empirical Equations (2) and (3).

For tubes with two grid electrodes or less the effects of these empirical equations are reproduced by following heuristic equation for $D_j(e_j, e_b)$:

$$D_j \approx \left(1 + \frac{1}{25r_j}\right)^{4 \cdot S\left(\frac{e_b}{e_j}\right)} \cdot \delta_j \cdot \left(\frac{e_b}{e_j}\right)^{r_j \cdot \left(1 + 3 \cdot S\left(\frac{e_b}{e_j}\right)\right)} \quad (8a)$$

With, $$S(w) = e^{-w}, w > 0$$

Where:

$e_j$=control grid voltage $e_1+\varepsilon$ or screen grid voltage $e_2$, $\delta_j$=current division factor, measured by the ratio of plate to grid current for equal plate and positive grid voltages.

$r_j$=grid dependent inverse power law where $r_1 \approx \frac{1}{2}$ and $r_2 \approx \frac{1}{5}$.

The current division heuristic (8a) may be understood by noting that S(w) has values between zero and one.

Equation 8b provides a current division heuristic according to other embodiments of the inventive concept, which may provide improved accuracy, but may take more time to compute:

$$D_j \approx \left(1 + \frac{1}{25r_j}\right)^{4 \cdot S\left(\frac{e_b}{e_j}\right)} \cdot \delta_j \cdot \left(\frac{e_b}{e_j}\right)^{r_j \cdot 4^{S\left(\frac{e_b}{e_j}\right)}} \quad (8b)$$

Its effect with triodes is seen by setting $r_1=\frac{1}{2}$ and examining the two cases S(w)=0 and S(w)=1. Doing so gives Equation (2). The empirical constant 1.392 in Equation (2) becomes 3.360 in Equation (8a), however this value is adequate for practical purposes.

Its effect with beam tetrodes/pentodes is similarly seen by setting $r_2=\frac{1}{5}$, and examining the two cases S(w)=0 and S(w)=1. Doing so gives Equation (3). In addition it gives the case shown below:

$$D_2 \approx 2.07 \, \delta_2 \cdot \left(\frac{e_b}{e_2}\right)^{\frac{4}{5}}, \, e_b \leq 0.25 e_2 \quad (9)$$

Note that Equations (2) and (3) were validated from observation of specific tube types (i.e. (2) for triodes and (3) pentodes). Heuristic Equation (8a) applies instead to a specific grid irrespective of tube type e.g. grid 1 may belong to a triode or a pentode. That is, $D_1(e_1, e_b)$ as computed by (8a) may be used for pentodes.

Other feature of Equations (7) and (8a) are:

Current division is defined generally for triodes and beam tetrodes/pentodes to be consistent with the generality of Equation (1).

They unify separate equations and in the process identify the case given by Equation (9) which was not addressed previously.

The sharp knee in the current division characteristic when a voltage range transition occurs, i.e., at the transition between the two empirical power laws of Equation 2, is rounded and in accordance with graphical evidence.

Current division is generalized for multi-grid situations just like the three-halves-power law for total space current.

Electrode Currents

Tube electrodes at a negative or zero potential with respect to the cathode may have no appreciable current flowing through them. Total space current may, thus, be distributed between the plate and any grid electrodes that are at a positive potential with respect to the cathode.

$$I_{sp} = I_b + \sum_{j=1}^{n} k_j \cdot I_j \quad k_j = \begin{cases} 0, & e_j \le 0 \\ 1, & e_j > 0 \end{cases} \quad (10)$$

Where:

$I_{sp}$ = total space current $e_j$ = voltage at grid electrode j $I_j$ = current flowing through grid electrode j Equation (10) restated in terms of the current division Equations of (8a) gives:

$$I_{sp} = I_b \cdot \left(1 + \sum_{j=1}^{n} \frac{k_j}{D_j}\right) \quad k_j = \begin{cases} 0, & e_j \le 0 \\ 1, & e_j > 0 \end{cases} \quad (11)$$

Plate current is thus determined as shown below:

$$I_b = \frac{I_{sp}}{\left(1 + \sum_{j=1}^{n} \frac{k_j}{D_j}\right)} \quad k_j = \begin{cases} 0, & e_j \le 0 \\ 1, & e_j > 0 \end{cases} \quad (12)$$

The current through any positive grid electrodes can then be determined by current division equations.

The thermionic vacuum tube model, according to some embodiments of the inventive concept, may be governed by processes executed by the triode model parameters module 335 and beam the tetrode/pentode model parameters module 337. These processes/determinations may include, but are not limited to those described below.

For convenience of description, the modified model will be described as it applies to triodes and beam tetrodes/pentodes separately. Both tube types however use the same basic Equations (4), (5), (6), (8a) and (12).

Note that the model for pentodes described here, according to some embodiments of the inventive concept, may be the same as for beam tetrodes in that only the first two pentode grids are handled by the model. The third pentode grid (i.e. the suppressor grid) may be assumed to be connected to the cathode.

Triode Model

From (4) the polynomial variable is:

$$x(e_1, e_b) = \frac{e_1 + \varepsilon}{\left(\frac{e_b}{\mu}\right)} \quad (13)$$

From (5) amplification factor is:

$$\mu'(e_1, e_b) = \sum_{i=0}^{n} a_i \cdot \text{Min}\left(0, \frac{e_1 + \varepsilon}{\left(\frac{e_b}{\mu}\right)}\right)^i \quad (14)$$

From (6) total space current is:

$$I_{sp} \approx G \cdot \left((e_1 + \varepsilon) + \frac{e_b}{\mu'(e_1, e_b)}\right)^{\frac{3}{2}} \quad (15)$$

From (8a) the current division expression is:

$$D_1 \approx \left(1 + \frac{1}{25 r_1}\right)^{4 \cdot S\left(\frac{e_b}{e_1}\right)} \cdot \delta_1 \cdot \left(\frac{e_b}{e_1}\right)^{r_1 \cdot \left(1 + 3 \cdot S\left(\frac{e_b}{e_1}\right)\right)} \quad (16)$$

With, $S(w) = e^{-w}, w > 0$

From (12) the plate current is:

$$I_b = \frac{I_{sp}}{\left(1 + \frac{k_1}{D_1}\right)}, \quad k_1 = \begin{cases} 0, & (e_1 + \varepsilon) \le 0 \\ 1, & (e_1 + \varepsilon) > 0 \end{cases} \quad (17)$$

A problem with (17) is that on transition between positive and negative grid operation $I_b$ may experience a step change in value caused by the equation's inclusion or elimination of grid current. This may adversely affect the calculation of derivative based (dynamic) properties such as voltage gain, mutual conductance and plate resistance in the transition region and may cause unwanted artefacts in simulation.

An approach that may be taken to smooth this discontinuity, according to some embodiments of the inventive concept, is to add a part of the grid current back into the plate current during transition. This small contribution to plate current may gradually diminish as tube operation moves farther away from the transition boundary.

When smoothing is applied to (17) the plate current is:

$$I_b = I_{sp} \cdot \left(\frac{1 + \frac{k_1}{D_1} \cdot T(e_1, e_b)}{1 + \frac{k_1}{D_1}}\right) \quad (18)$$

wherein $k_1 = \begin{cases} 0, & (e_1 + \varepsilon) \le 0 \\ 1, & (e_1 + \varepsilon) > 0 \end{cases}$ $$T(e_1, e_b) = e^{\frac{-(e_1 + \varepsilon)}{\left(\frac{e_b}{\mu}\right)}}, (e_1 + \varepsilon) > 0 \quad (19)$$

From (7) the grid current is:

$$I_1 = \frac{I_b}{D_1} \quad (20)$$

Or by:

$$I_1 = I_{sp} - I_b \quad (21)$$

Equation (21) above uses Equation (10) as expressed for triodes. From a computation perspective it may suffer from the loss of significant figures due to subtraction of very nearly equal quantities, a situation that may occur at grid current transition.

Beam Tetrode/Pentode Model

From Equation (4) the polynomial variable is:

$$x(e_1, e_2, e_b) = \frac{e_1 \varepsilon}{\left(\frac{e_2}{\mu_2} + \frac{e_b}{\mu}\right)} \quad (22)$$

From Equation (5) the amplification factors are:

$$\mu_2'(e_1, e_2, e_b) = \sum_{i=0}^{n} a_i \cdot \mathrm{Min}\!\left(0, \frac{e_1 + \varepsilon}{\frac{e_2}{\mu_2} + \frac{e_b}{\mu}}\right)^{i} \quad (23)$$

$$\mu'(e_1, e_2, e_b) = \mu \quad (24)$$

Note that for these tube types function $\mu'$ may be adequately approximated by a constant e.g. the original amplification factor that would have been chosen if using (1).

From (6) total space current is:

$$I_{sp} \approx G \cdot \left((e_1 + \varepsilon) + \frac{e_2}{\mu_2'(e_1, e_2, e_b)} + \frac{e_b}{\mu'(e_1, e_2, e_b)}\right)^{\frac{3}{2}} \quad (25)$$

From (8a) the current division expressions for the control grid and the screen grid are respectively:

$$D_1 \approx \left(1 + \frac{1}{25 r_1}\right)^{4 \cdot S\left(\frac{e_b}{e_1}\right)} \cdot \delta_1 \cdot \left(\frac{e_b}{e_1}\right)^{r_1 \cdot \left(1 + 3 \cdot S\left(\frac{e_b}{e_1}\right)\right)} \quad (26)$$

$$D_2 \approx \left(1 + \frac{1}{25 r_2}\right)^{4 \cdot S\left(\frac{e_b}{e_2}\right)} \cdot \delta_2 \cdot \left(\frac{e_b}{e_2}\right)^{r_2 \cdot \left(1 + 3 \cdot S\left(\frac{e_b}{e_2}\right)\right)} \quad (27)$$

With,
$S(w) = e^{-w}, \; w > 0$

From (12) the plate current is:

$$I_b = I_s \cdot \left(\frac{1 + \frac{k_1}{D_1} T(e_1, e_b)}{1 + \frac{k_1}{D_1} + \frac{k_2}{D_2}}\right) \quad (28)$$

$k_2 = 1, \; e_2 > 0$

As was done for the triode when smoothing to handle the transitioning of the control grid, current flow is applied to Equation (28), such that the plate current is:

$$I_b = I_{sp} \cdot \left(\frac{1 + \frac{k_1}{D_1} \cdot T(e_1, e_b)}{1 + \frac{k_1}{D_1} + \frac{k_2}{D_2}}\right) \quad (29)$$

wherein $$k_1 = \begin{cases} 0, & (e_1 + \varepsilon) \leq 0 \\ 1, & (e_1 + \varepsilon) > 0 \end{cases} \quad \text{and}$$

$k_2 = 1, \; e_2 > 0$ $$T(e_1, e_b) = e^{\frac{-(e_1 + \varepsilon)}{\left(\frac{e_b}{\mu_2}\right)}}, \quad (e_1 + \varepsilon) > 0 \quad (30)$$

Note the current division expression $D_1$ for the control grid of beam tetrodes/pentodes is discretionary as described previously. This is not an issue for tube operation in the negative control grid region.

From (7) the grid currents are:

$$I_1 = \frac{I_b}{D_1} \quad (31)$$

$$I_2 = \frac{I_b}{D_2} \quad (32)$$

The thermionic vacuum tube model, according to some embodiments of the inventive concept, may be governed by processes executed by the tuning and limit parameters module 340. These processes/determinations may include, but are not limited to those described below.

Additional Parameters

The two groups of parameters for the tube model that have been described so far are:
Parameters of the three-halves-power law model
Parameters introduced by the model extensions The first two groups have been discussed in previous sections. A third group that may be used for practical application of the model may include parameters for tuning and limiting the result values of the model equations. These may be used to balance error and safeguard equations from being used outside their intended operating range. They are shown in Table I.

TABLE I

TUNING AND LIMIT PARAMETERS

| Parameter | Usage |
|---|---|
| $l_{adj}$ | |
| Tunes the power law of equations (15) and (25) as actual tubes can show appreciable departures. | $\frac{3}{2} + l_{adj}$ |
| $k_\mu$ | |
| Tunes the amplification factor polynomial to cancel or balance error components of equations (15) and (25). | (See usage below) |
| $\mu_{floor}, \mu_{ceil}$ | |
| Floor and ceiling values for when the amplification factor polynomial is used beyond its range of application. | $k_\mu + \mathrm{Min}(\mu_{ceil}, \mathrm{Max}(\mu_{floor}, \mu_k(x)))$ |

TABLE I-continued

TUNING AND LIMIT PARAMETERS

| Parameter | Usage |
|---|---|
| $z_{floor}$ | |
| Prevents divide by 0 and overflow in polynomial variable and in smoothing functions. | $\dfrac{e_1 + \varepsilon}{\text{Max}\left(z_{floor}, \dfrac{e_l}{\mu_2} + \dfrac{e_3}{\mu_3} + \ldots + \dfrac{e_{ij}}{\mu}\right)}$ $\dfrac{-(e_1 + \varepsilon)}{\text{Max}\left(z_{floor}, \left(\dfrac{e_{ij}}{\mu_1}\right)\right)}$ |

Polynomial Approximation Example

A 3rd order polynomial form of equation (14) was fitted to the amplification factor of the 12AX7. This polynomial and that in other work, e.g., Cardarilli et al., Improved Large-Signal Model for Vacuum Triodes, in IEEE International Symposium on Circuits and Systems (ISCAS), 2009. pp 3006-3009, or amplification factor have the same form. That is they are univariate polynomials in that they have the form of Equation (33).

$$\mu_{poly}(x) = \sum_{i=0}^{3} a_i \cdot x^i \tag{33}$$

Figure 9:
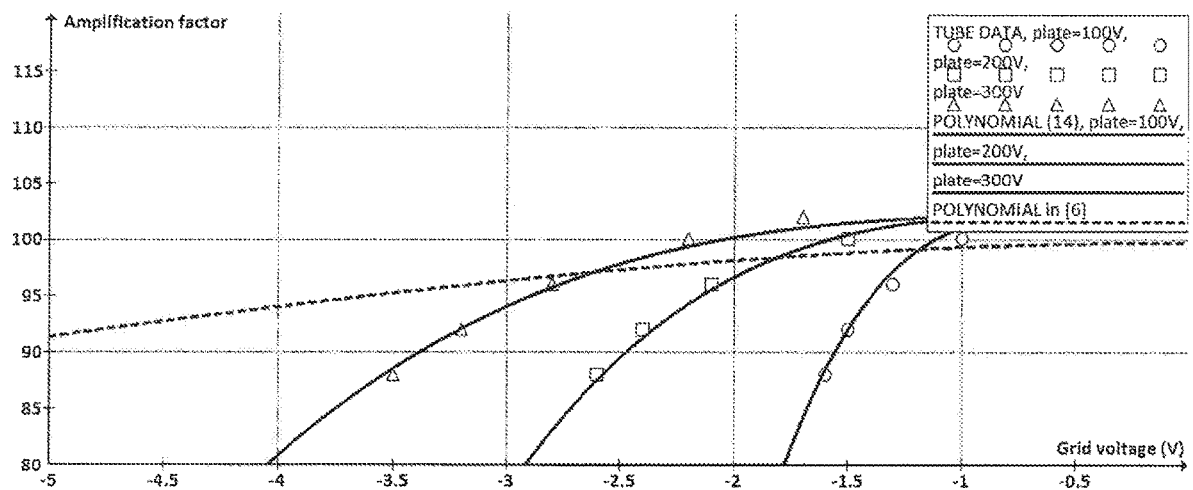
FIGS. 9-23 are graphical representations illustrating the simulation and/or estimation of operations of actual thermionic vacuum tubes according to some embodiments of the inventive concept.

The coefficients and variables of both methods are shown in Table II. Their respective fit to the 12AX7 amplification factor is shown in FIG. 9 in which the "Polynomial" refers to the chart in Spangenburg, Vacuum Tubes, $1^{st}$ ed., New York; McGraw-Hill Book Co., 1948, ch 9, 11, pp. 224, 273.

TABLE II

12AX7 AMPLIFICATION FACTOR

| $\mu_{poly}$ Equation (33) | Polynomial in Cardarilli | Polynomial Equation (14) |
|---|---|---|
| $a_0$ | 99.704829344364796 | 102.15 |
| $a_1$ | −0.022980852114950 | 0.88558 |
| $a_2$ | −0.448893261889592 | −2.0554 |
| $a_3$ | −0.22265711331488 | 11.533 |
| x | $e_3$ | $\text{Min}\left(0, \dfrac{e_1 + \varepsilon}{\dfrac{e_b}{\mu}}\right)$ |
| $\varepsilon$ | n/a | 0.65 |
| $\mu$ | n/a | 103 |

Current Division Examples

Current division data was extracted for the 35T and 6V7 tubes.

Current Division Parameters

The current division factor and the power law for the 35T triode and the 6V7 pentode are shown in Table III.

TABLE III

CURRENT DIVISION PARAMETERS

| Parameter | 35T | 6V7 |
|---|---|---|
| δ | 1.77 | 3.1 |
| r | 0.65 | 0.19 |

Power laws of ½ for triodes or ⅕ for beam tetrodes/pentodes in equation (8) are regarded as defaults. See the chart for the 35T in Spangenburg, Vacuum Tubes, $1^{st}$ ed., New York; McGraw-Hill Book Co., 1948, ch 9, 11, pp. 224, 273 that exhibits power law variation, with respect to grid voltage.

Figure 10:
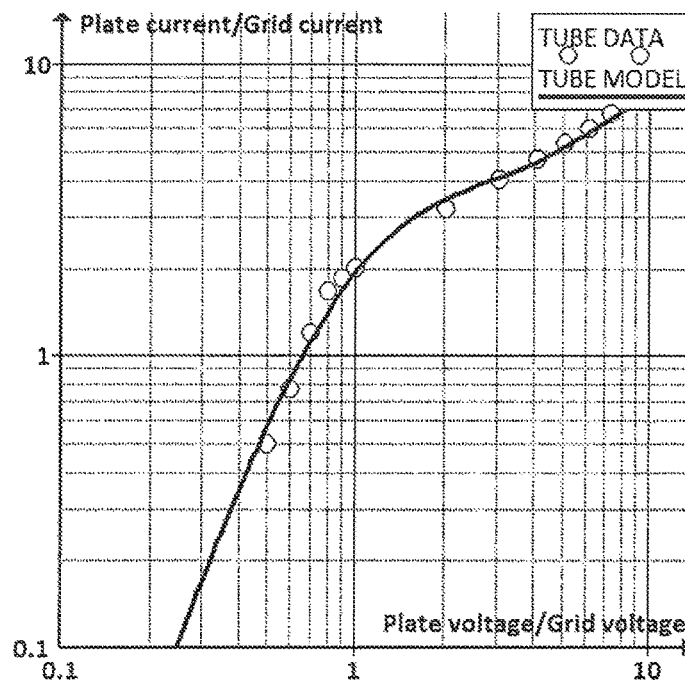
Figure 11:
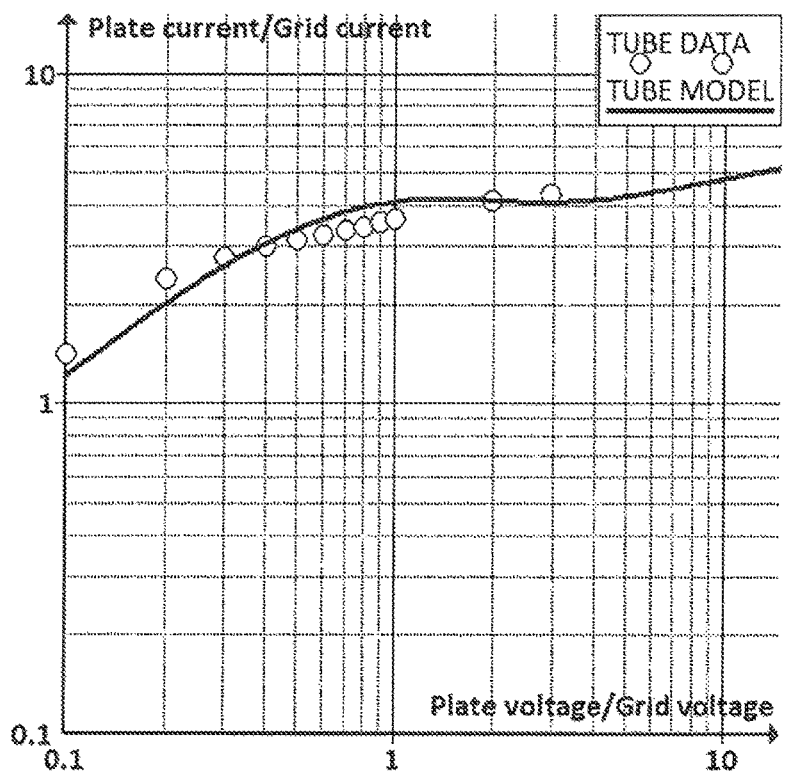
Figure 12:
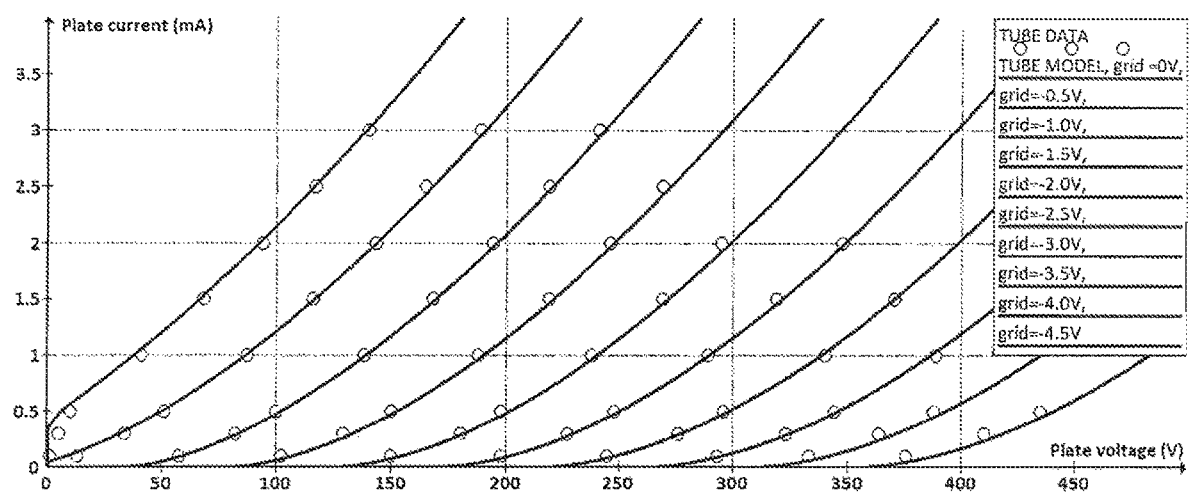
Figure 13:
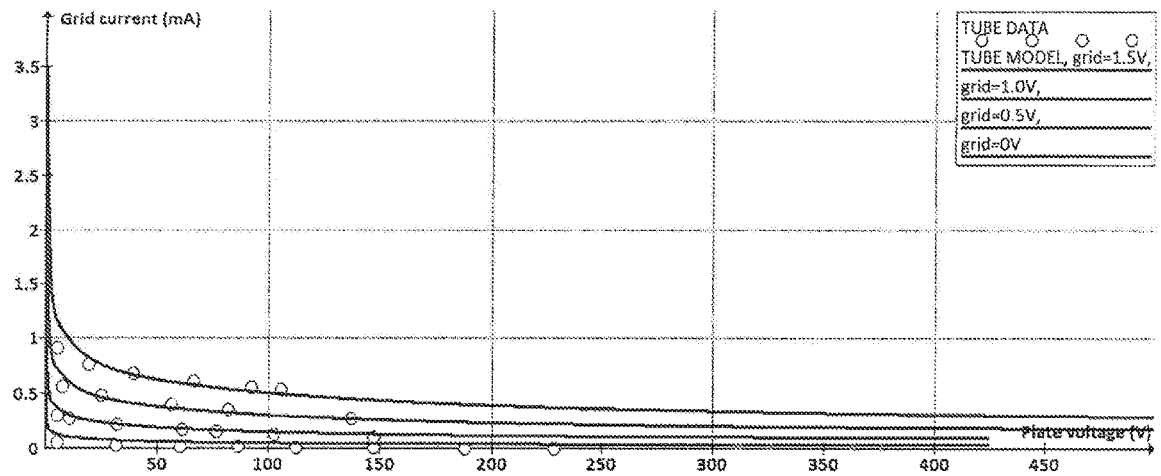
Figure 14:
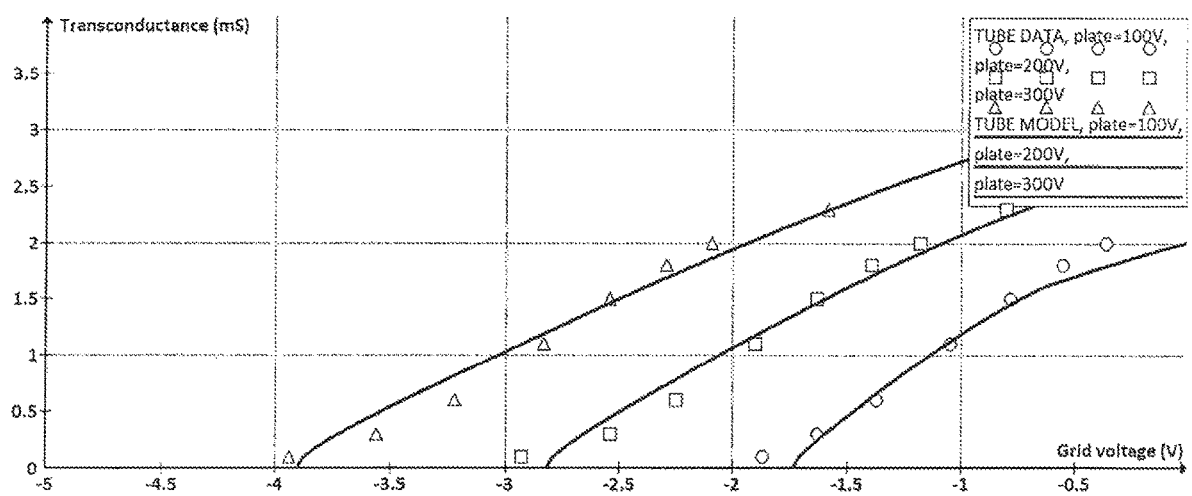
Figure 15:
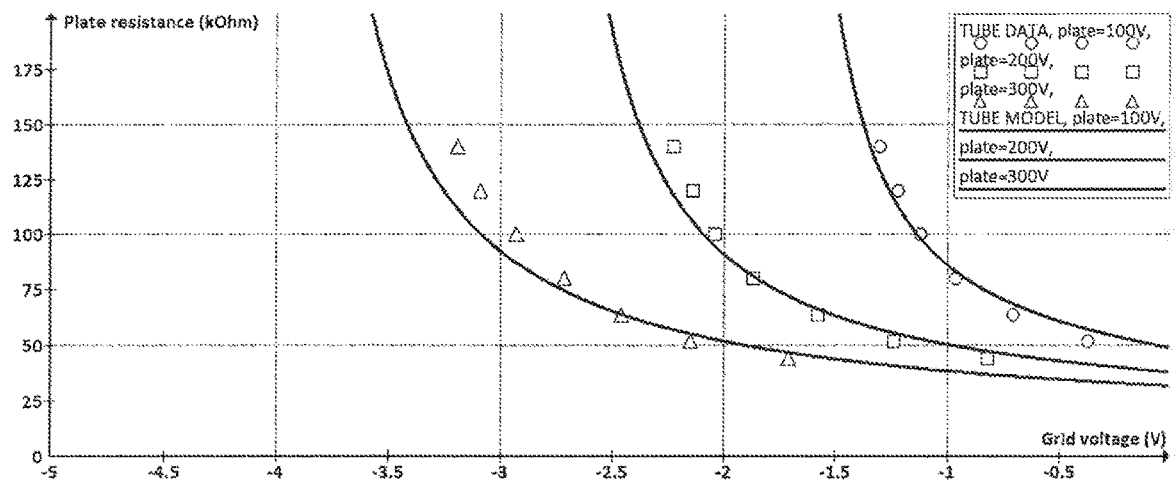
Figure 16:
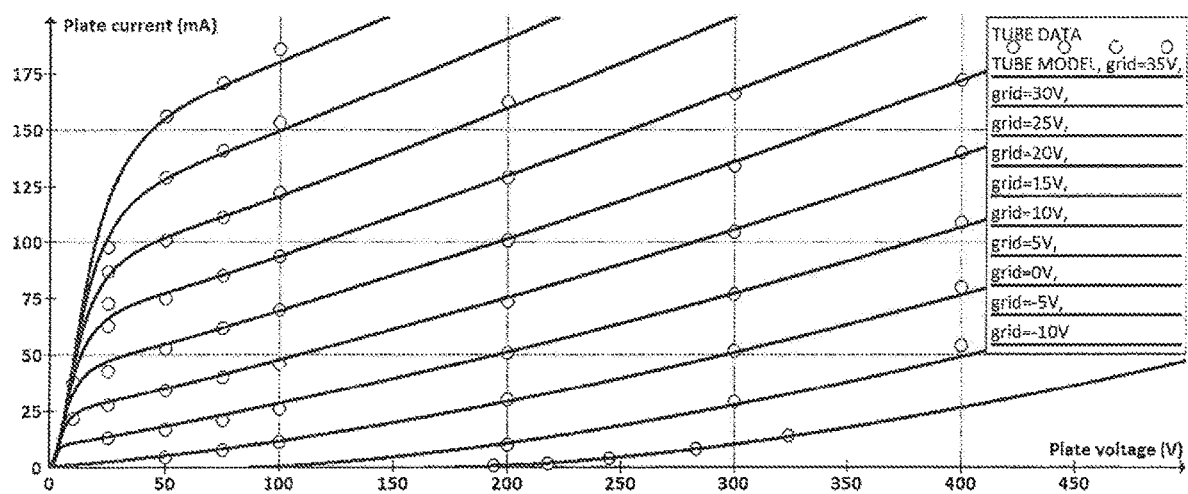
Figure 17:
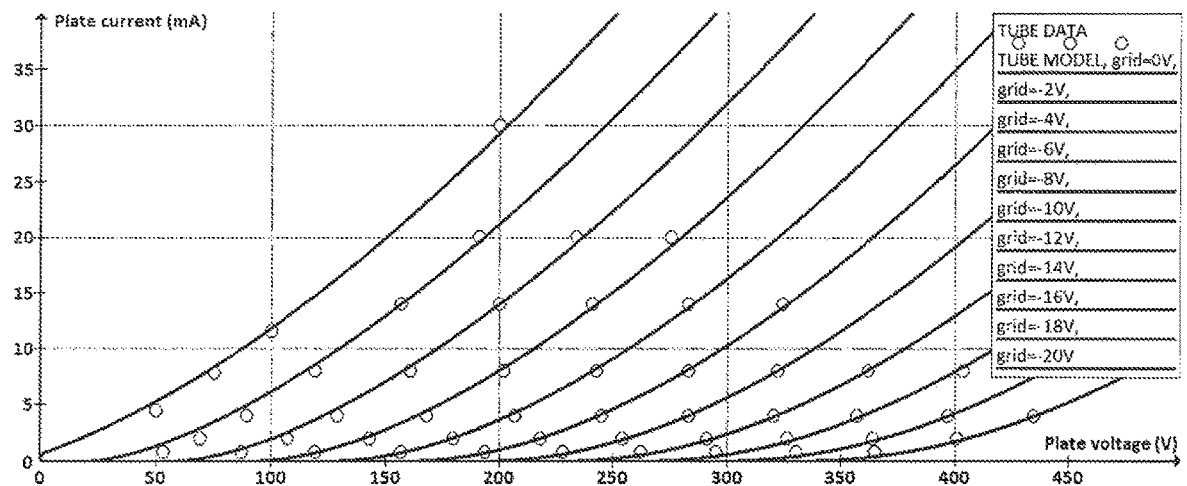
Figure 18:
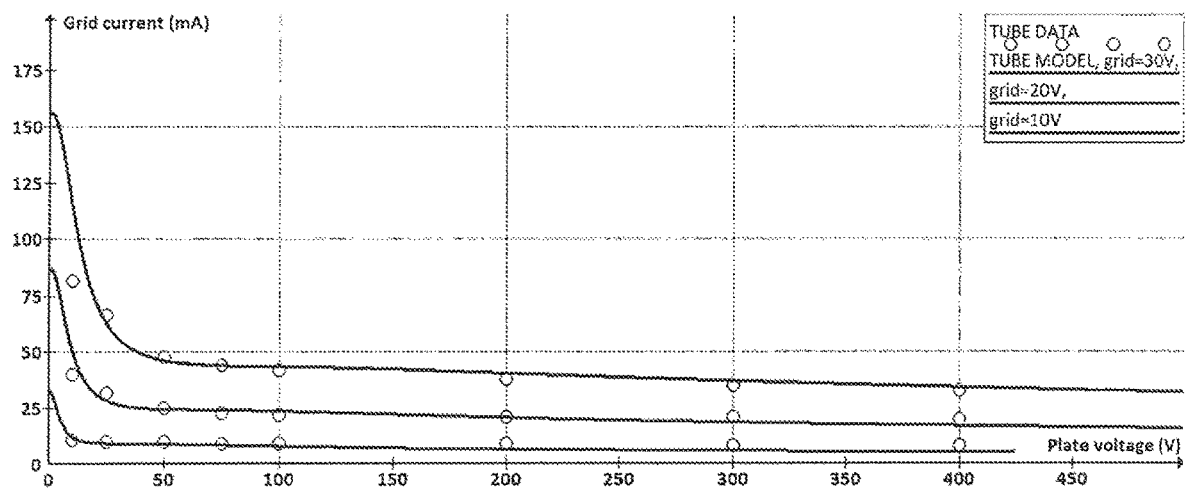
Figure 19:
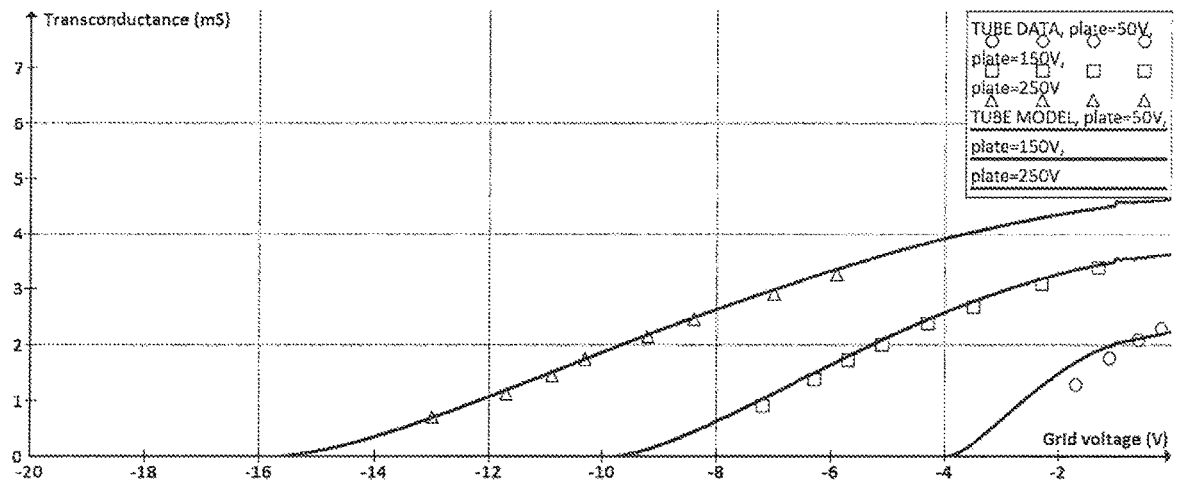
Figure 20:
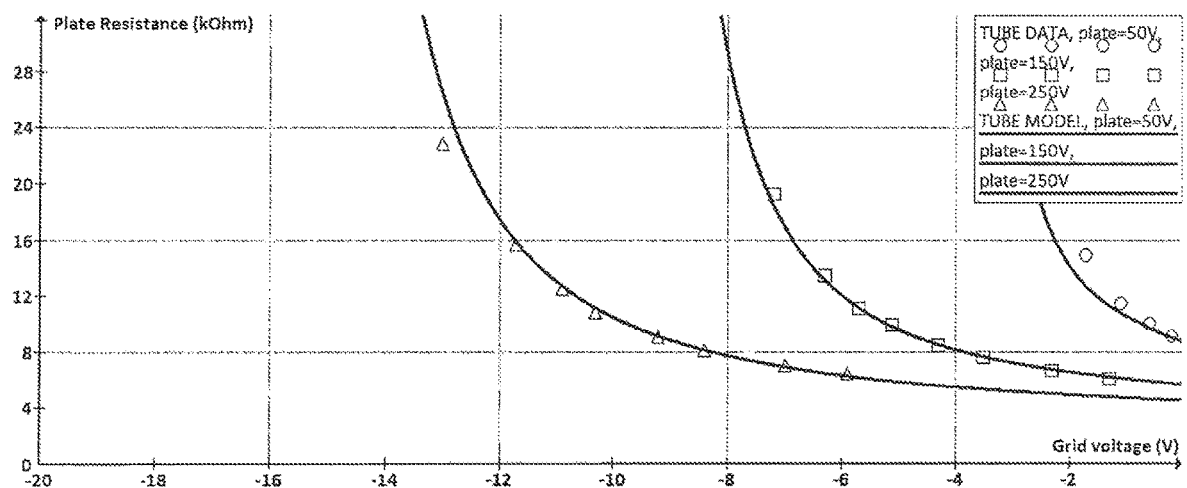

Equations (16) and (27) are compared with actual tube data in FIG. 10 and FIG. 11, respectively A benefit of using Equation (8a) is that the transition between the two empirical power laws of Equation (2) may occur smoothly with electrode voltages. In addition (8a) also shows increased accuracy when $e_b \leq 0.25\, e_2$ as this case was not previously addressed. In contrast with conventional models, Equation 8 can be used for plate to grid voltage ratios less than one as shown in FIG. 11.

Complete Tube Model Examples

The extended model was fitted to the 12AX7 and 6SN7 triodes and to the 6BQ5 pentode.

Their model parameter values are shown in Table IV. Characteristic curves were generated for each of these tubes and compared with manufacturer published data.

TABLE IV

MODEL PARAMETERS

| Parameter | 12AX7 | 6SN7 | 6BQ5 |
|---|---|---|---|
| G | $1.066.6 \times 10^{-8}$ | $0.90957 \times 10^{-8}$ | $4.1624 \times 10^{-8}$ |
| $\mu$ | 92.0 | 19.511 | 550 |
| $\mu_z$ | n/a | n/a | 19.4 |
| $\epsilon$ | 0.65 | 1.0 | 0.60 |
| $a_o$ | 102.15 | 20.510 | 20.904 |
| $a_1$ | 0.88558 | 0.52984 | 0.24092 |
| $a_2$ | −2.0554 | 2.0232 | −4.3924 |
| $a_z$ | 11.533 | 4.6077 | 0 |
| $\delta_1$ | 1.15 | 1.80 | 11.0 |
| $\delta_2$ | n/a | n/a | 8.5 |
| $r_1$ | 0.55 | 0.48 | 0.65 |
| $r_2$ | n/a | n/a | 0.255 |
| $I_{adj}$ | 0.06 | 0 | 0.01 |
| $k_\mu$ | 4.5 | 1.4 | 1.8 |
| $\mu_{floor}$ | 83 | 15.5 | 13.4 |
| $\mu_{ceil}$ | 103 | 21.0 | 21.0 |
| $s_{floor}$ | 0.005 | 0.005 | 0.005 |

12AX7 Triode

FIGS. 12-15 show characteristics generated by the extended model fitted to the 12AX7.

6SN7 Triode

FIGS. 16-20 show characteristics generated by the extended model fitted to the 6SN7. A discontinuity is evident in the transconductance curves of FIG. 19. It is a computational artifact due to the conditional handling of grid current as $e_1 + \delta$ transitions through the 0V level. This artifact may be more noticeable if Equation (17) is used to calculate plate current as it excludes the smoothing approach of Equation (18) described above.

This artifact may be expected in all models using this common mathematical construct to grid current, but it may become obscured if the graph's step size is insufficiently granular.

6BQ5 Pentode

Figure 21:
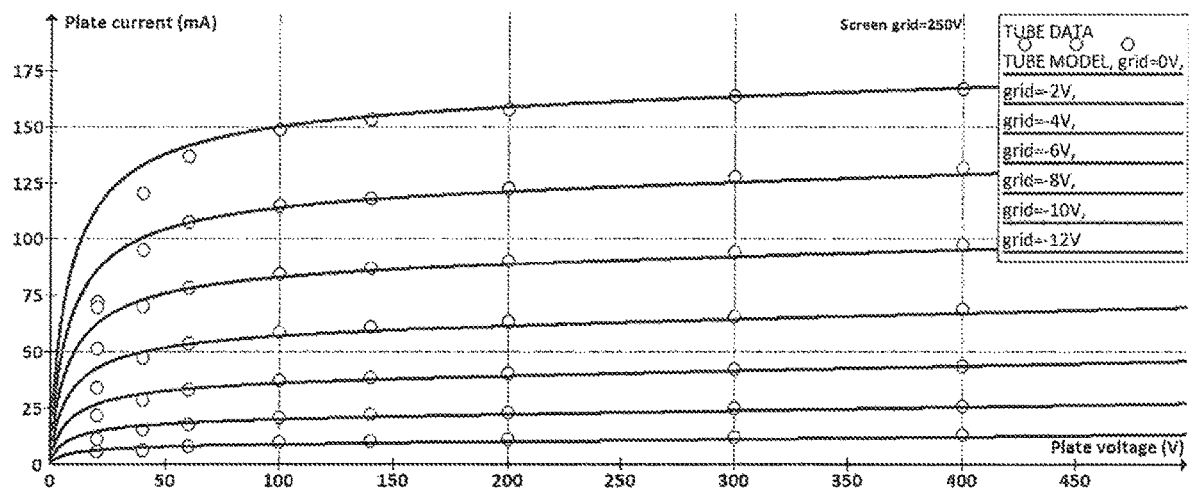
Figure 22:
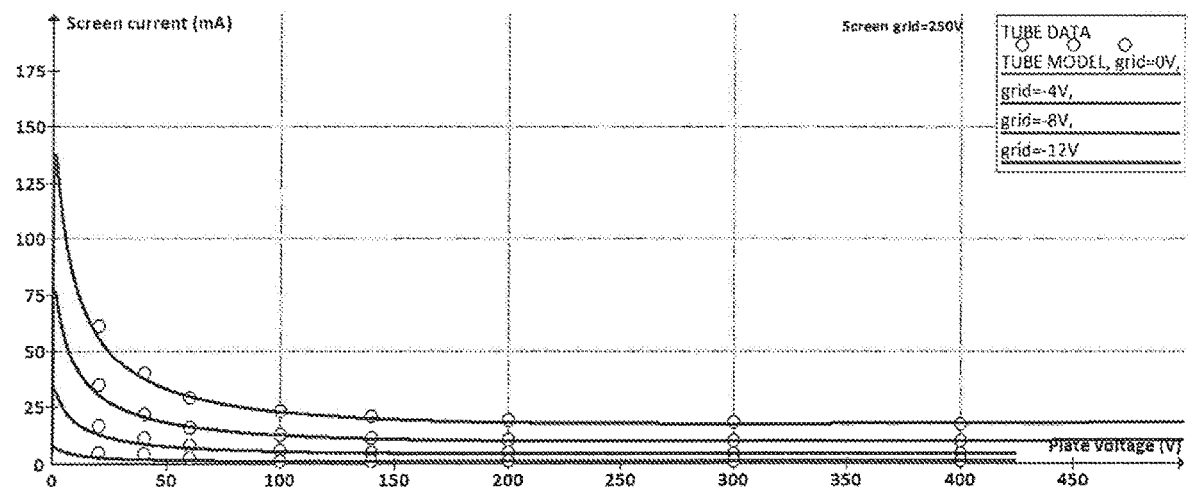
Figure 23:
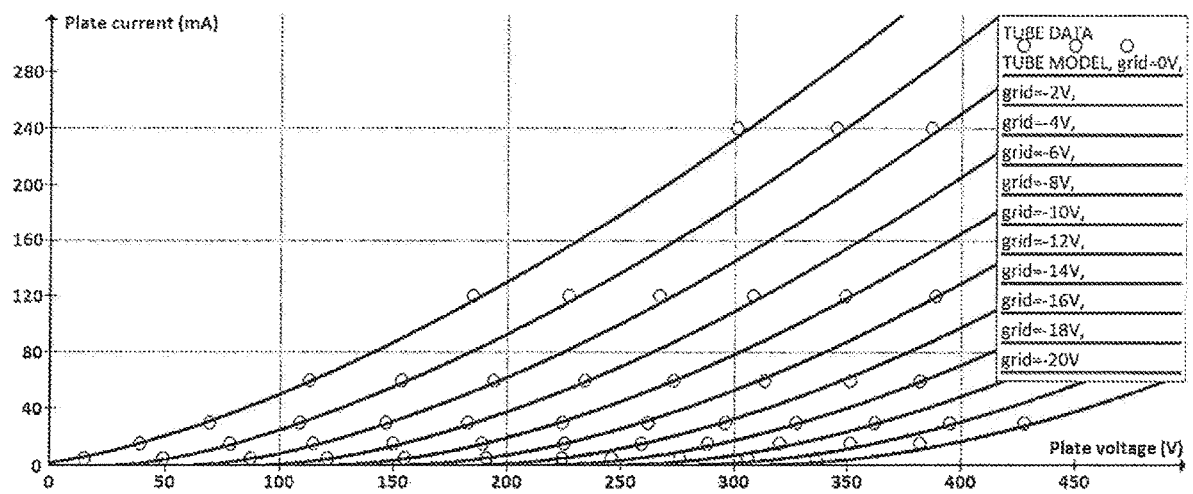

FIGS. 21-23 show characteristics generated by the extended model fitted to the 6BQ5.

Simulation Results

Transient analysis simulations of Class A amplifier circuits were used to determine the large signal performance of the modeled tubes.

12AX7 and 6SN7 Voltage Gain

Figure 24:
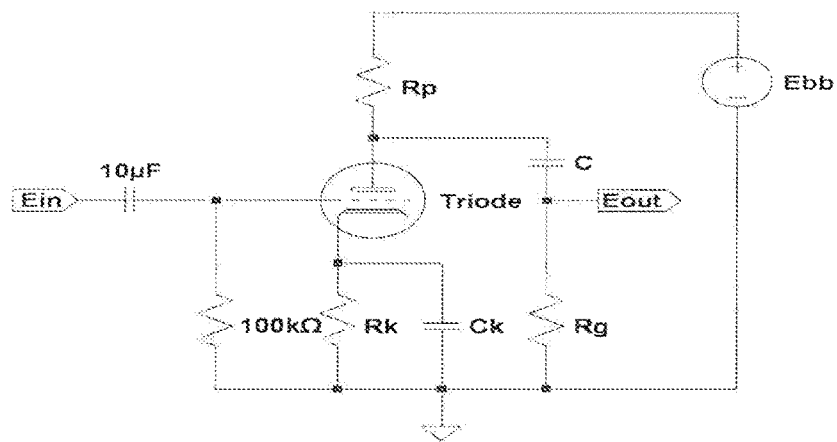
FIGS. 24-26 are circuit diagrams of thermionic vacuum tubes whose operation is simulated and/or estimated in a SPICE circuit simulation according to some embodiments of the inventive concept.

The large-signal voltage gain of the circuit in FIG. 24 was determined for the conditions listed next. Component values are from data charts for the 6SN7 and 12AX7 tubes, respectively. Circuits fall into three groups corresponding to plate supply voltages of 90, 180, and 300 Volts respectively. Input voltage $E_{in}$ was adjusted to produce the value of $E_{out}$ given by the charts. The results for large-signal voltage gain are shown below in Table V:

TABLE V

VOLTAGE AMPLIFIER SIMULATION

| Circ. Num. | 12AX7 Gain | 12AX7 Model Gain | 12AX7 Absolute error | 6SN7 Gain | 6SN7 Model Gain | 6SN7 Absolute error |
| --- | --- | --- | --- | --- | --- | --- |
| 1 | 29 | 29.8 | 2.8% | 13 | 12.2 | 6.1% |
| 2 | 35 | 36.4 | 3.9% | 14 | 13.4 | 4.2% |
| 3 | 41 | 40.6 | 1.0% | 14 | 14.1 | 0.8% |
| 4 | 39 | 43.4 | 11.4% | 14 | 14.6 | 4.1% |
| 5 | 45 | 50.4 | 11.9% | 14 | 15.4 | 10.1% |
| 6 | 48 | 54.6 | 13.8% | 15 | 15.7 | 4.8% |
| 7 | 48 | 55.8 | 16.3% | 14 | 16.0 | 14.5% |
| 8 | 52 | 62.2 | 19.6% | 14 | 16.4 | 17.4% |
| 9 | 55 | 65.8 | 19.6% | 15 | 16.7 | 11.3% |
| 10 | 40 | 38.4 | 4.0% | 14 | 13.1 | 6.6% |
| 11 | 47 | 45.3 | 3.6% | 14 | 14.2 | 1.4% |
| 12 | 52 | 48.8 | 6.1% | 15 | 14.6 | 2.4% |
| 13 | 53 | 52.5 | 0.9% | 15 | 15.0 | 0.1% |
| 14 | 59 | 58.6 | 0.6% | 15 | 15.7 | 4.9% |
| 15 | 63 | 62.0 | 1.6% | 16 | 16.1 | 0.4% |
| 16 | 62 | 63.6 | 2.5% | 16 | 16.5 | 3.1% |
| 17 | 66 | 68.9 | 4.3% | 16 | 16.7 | 4.7% |
| 18 | 68 | 72.1 | 6.0% | 16 | 17.0 | 6.4% |
| 19 | 45 | 42.8 | 4.9% | 14 | 13.7 | 2.2% |
| 20 | 52 | 49.6 | 4.6% | 15 | 14.7 | 1.9% |
| 21 | 57 | 53.0 | 6.9% | 16 | 15.2 | 4.7% |
| 22 | 59 | 56.8 | 3.8% | 16 | 15.3 | 4.2% |
| 23 | 65 | 62.0 | 4.6% | 16 | 16.0 | 0.1% |
| 24 | 68 | 65.4 | 3.9% | 16 | 16.3 | 2.0% |
| 25 | 69 | 67.2 | 2.7% | 16 | 16.5 | 3.4% |
| 26 | 73 | 71.8 | 1.6% | 16 | 16.9 | 5.8% |
| 27 | 75 | 74.5 | 0.6% | 16 | 17.0 | 6.5% |

It is evident that circuits 4-9, for the 12AX7 and the 6SN7, show larger error in the modelled voltage gain (i.e., 10%-20%). These higher error circuits may be characterized by noting they are in the low power supply voltage group (i.e., Ebb=90V) and they involve the higher value plate resistors (i.e., Rp=220 k$\Omega$, 470 k$\Omega$). Circuits 1-3 which involve lower plate resistor values have lower error.

That is, according to some embodiments of the inventive concept, model voltage gain may be less accurate for circuits whose operation is confined to both the low voltage and the low current region of the tube's plate characteristics.

Additional validation of the model with extensions, as applied to triodes, is provided by the 6SN7 which is more difficult to model accurately compared to the 12AX7 due to the following factors; that is the 6SN7 amplification factor has greater relative variation in its typical operating area and its plate characteristics cover a wide range of both negative and positive control grid voltages.

6BQ5 Results

Figure 25:
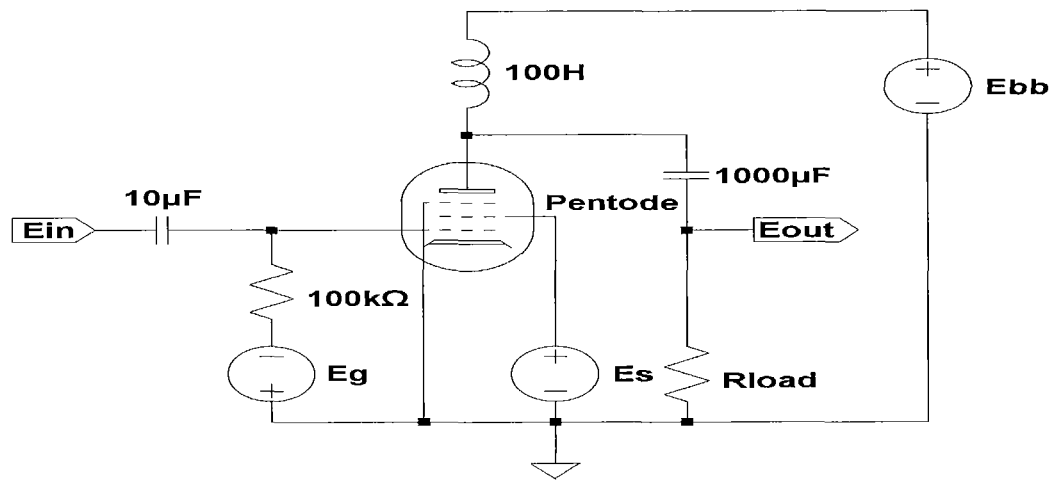
Figure 26:
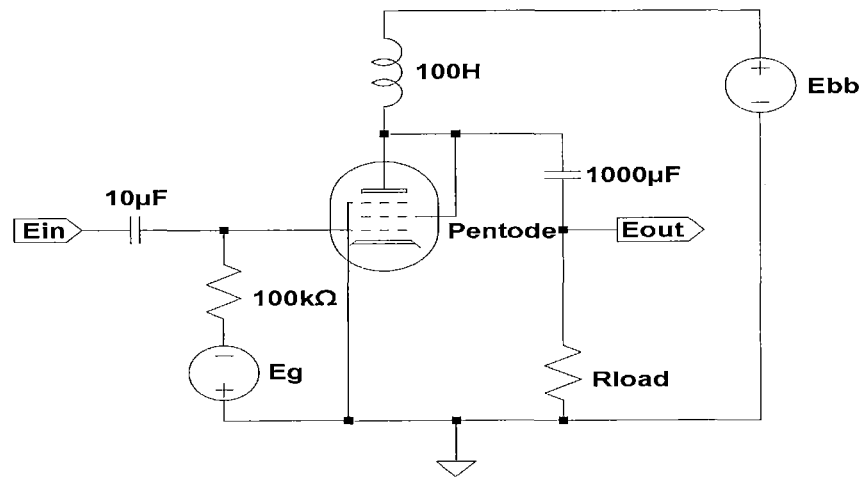

Transient analysis of the circuits shown in FIG. 25—pentode amplifier and FIG. 26—pentode amplifier in triode mode has been performed using acquired component values corresponding to the datasheet for the EL84 tube. The EL84 is the European equivalent designation for the 6BQ5 and its datasheet was chosen because it includes a breakdown of the harmonics generated by this tube.

These charts contain five amplifier circuits for this tube corresponding to the conditions shown below in Table VI:

TABLE VI

6BQ5 TEST CONDITIONS

| Circ. Num. | Ebb (Volts) | E$\epsilon$ (Volts) | Eg (Volts) | Rload (k$\Omega$) | Ein (Volts rms) |
| --- | --- | --- | --- | --- | --- |
| 1 | 250 | 250 | −7.3 | 5.2 | 4.3 |
| 2 | 250 | 250 | −7.3 | 4.5 | 4.4 |
| 3 | 250 | 250 | −8.4 | 7 | 3.5 |
| 4 | 250 | 210 | −6.4 | 7 | 3.4 |
| 5 | 250 | Triode mode | −9.2 | 3.5 | 6.7 |

The results are shown below in Table VII where for each circuit there are two rows listed, showing respectively, the published data and the corresponding values produced by the model:

TABLE VII

6BQ5 AMPLIFIER SIMULATION

| Circ. Num. | Plate current (mA) | Grid 2 Current (mA) | Output Power (Watts) | T.H.D % | $3^{rd}$ H.D % |
| --- | --- | --- | --- | --- | --- |
| $1_{Data}$ | 49.5 | 10.8 | 5.7 | 10 | 9.5 |
| $1_{Mod.}$ | 50.2 | 13.9 | 5.7 | 9.2 | 8.9 |
| $2_{Data}$ | 50.6 | 10 | 5.7 | 10 | 8 |
| $2_{Mod.}$ | 51.8 | 12.9 | 5.8 | 9.0 | 7.9 |
| $3_{Data}$ | 36.8 | 8.5 | 4.2 | 10 | 8.7 |
| $3_{Mod.}$ | 38.4 | 9.3 | 4.0 | 8.0 | 7.6 |
| $4_{Data}$ | 36.6 | 7.3 | 4.3 | 10 | 9.3 |
| $4_{Mod.}$ | 38.1 | 8.9 | 4.2 | 8.4 | 7.9 |
| $5_{Data}$ | 36.0 | — | 1.95 | 9 | — |
| $5_{Mod.}$ | 36.4 | — | 1.78 | 8.2 | — |

In general the model's computation of plate current and output power is on average approximately 3% in error. Screen grid current has significantly higher error that is attributed in part to the de-tuning of screen grid characteristics for the purpose of optimizing the 6BQ5 plate characteristics. On the basis of this tube's recommended applications the accuracy of the plate characteristics is given priority as they directly affect power output and harmonic distortion. Model performance may be useful for circuit analysis and for real-time signal acoustic emulation and the distortion signature characteristic of pentodes (i.e., a dominant $3^{rd}$ harmonic) is well reproduced. Similarly, when the 6BQ5 is operating in triode mode the distortion signature of triodes may also be obtained.

Model Parameter Determination

Determining the model parameters of a real tube may involve an iterative procedure. This is because the equations governing the model are approximate and, as a result, there may be error in the predicted value produced by each model equation. Iteration may be required to tune parameters so as to balance out as much as possible these individual errors and achieve a lower overall error in total space current.

Table VIII outlines the major steps of this iterative procedure according to some embodiments of the inventive concept. Such embodiments have been described above, for example, with reference to the flowchart of FIG. 8.

TABLE VIII

Model Fitting Outline

| Step | Considerations |
|---|---|
| 1. Set initial values for $\varepsilon$, $\mu$, $\mu_x$, $l_{adj}$ | The correction constant $\varepsilon$ is $|\varepsilon| \leq 2$. The average for example tubes here may be used. This is $\varepsilon = 0.75$. From tube datasheets obtain a value for triode amplification factor $\mu$ or pentode amplification factor $\mu_z$. Set $l_{adj} = 0$ unless modelling directly heated tubes and/or the cathode is not regarded as an equipotential surface |
| 2. Determine the coefficients of the amplification factor Equation (5) | The tube models presented in this work use least squares approximation, but any available method may be used. Only points sampled for negative grid operation are used in determining coefficients i.e. the least squares polynomial does not involve the Min function present in Equation (5). Fine tune by adjusting triode $\mu$ or pentode $\mu_x$ as applicable. A chart like that of FIG. 9 may be useful for this. |
| 3. Set initial values for space current equation parameters P, $k_\mu$, $\mu_{floor}$, $\mu_{ceil}$ | Perveance G is an average value computed from samples taken over the published operating region of the tube's plate characteristics. Parameter $k_\mu$ is intended for tuning and thus its value is expected to be small in comparison to the usable amplification factor of the tube. The example tubes use values in the range of 5% to 10% of the average of amplification factor samples. (See Table I) Parameters $\mu_{floor}$, $\mu_{ceil}$ reflect the range in the data samples of tube amplification factor. These parameters are used to remove aberrations to space current when the Equation (5) is used outside the amplification factor range it has been fitted to. (See Table I) |
| 4. Fit total space current Equation (15) for triodes or (25) for pentodes to published tube characteristics | Adjust $k_\mu$ to fit total space current from equation to the published (negative grid) plate characteristics of the tube. For pentodes getting total space current data and the adjustment of $k_\mu$ are more easily performed using the tube's triode mode connection plate characteristics. Fine tune by adjusting $l_{adj}$ to change the power law to produce a closer fit for dynamic characteristics of the tube. Adjust $\mu_{floor}$, $\mu_{ceil}$ to remove artefacts if any. |

TABLE VIII-continued

Model Fitting Outline

| Step | Considerations |
|---|---|
| 5. Set values for the variables $r_v, r_z$, $\delta_v, \delta_z$ of the grid current Equation (16) for triodes or the Equations (26) and (27) for pentodes | Let $r_1 = \dfrac{3}{z}$ and $r_z = \dfrac{3}{s}$. Use charts like those of FIGS. 10 and 11 to determine suitable initial values for $\delta_v, \delta_z$. As required re-adjust $r_v, r_z$ and then $\delta_v, \delta_z$ for best fit |
| 6. Fit total plate current Equation (18) for triodes or (29) for pentodes to published tube characteristics | Adjust $\delta_v, \delta_z$ for best fit to the published (positive and negative grid) plate characteristics while ensuring the positive grid current characteristics remain at acceptable accuracy |

The vacuum tube model extensions presented affect two main areas of interest for actual tubes. The first addresses the dependence of amplification factor on multiple tube electrode voltages. The second addresses disparities and gaps of the empirical expressions that give grid currents. To evaluate the capabilities of the model with these extensions, the following perspectives have been used:

Generality i.e. applicability to triodes, tetrodes, pentodes etc.

Error i.e. how closely circuit simulations using the model reproduce the actual circuit measurements of large-signal circuit properties.

Coverage i.e. the extent of the tube operating area that the model is applicable to.

Generality

Generality of the model extensions is demonstrated by their application to both the triode and beam tetrode/pentode.

Generality is an existing feature of the total space (i.e. cathode) current Equation (1) which applies to tubes with any number of electrodes. The improvements here may preserve this.

More difficult is achieving generality in the calculation of individual electrode currents through current division functions. No simple, analytical form for such functions is known. Empirical functions have been found that account for the grid current of triodes and the screen current of pentodes. Based on the empirical functions, embodiments presented here may provide a more general expression to calculate these two currents, but which also includes a previously not considered case for screen current, when the tube's plate voltage is low compared to its screen grid voltage. This existence of this extra case is visible in the current division chart of the 6V9.

A novel perspective is that Equation (8a) may be viewed as a heuristic applicable to every grid in a tube. The reasoning behind its use to determine control grid current in pentodes was provided and was demonstrated in the model of the 6BQ5. Nevertheless, control grid current for pentodes may be a discretionary generalization of Equation (8a) as this equation originates from empirical equations specific to tube type.

Error

Error of the model with the extensions varies across the tube operating area, as does the relative importance of regions within that operating area.

An overview of error regions may be gained by separating the test circuits into two groups, those whose large-signal operation is substantially outside low voltage and current regions and those remaining.

The first group of circuits has errors of a few percent. The second group's error is approximately threefold on average for the 12AX7 and 6SN7. For the 6BQ5 no manufacturer published circuits that could be put into this second group were found.

The 6BQ5 however has manufacturer published harmonic distortion data that allowed additional comparisons to be made. Distortion fidelity is a desirable feature for a tube model and the error of the 6BQ5 circuits for total harmonic and dominant harmonic distortion is respectively 13% and 9% on average, and not above 20% and 13% for the worst cases.

Lower model error, according to some embodiments of the inventive concept, has been achieved by capturing the dependence of amplification factor on multiple tube electrode voltages. That is, by using Equation (4) as the variable of a univariate polynomial fitted to amplification factors.

The accurate screen current modelling at low plate voltages may be a pentode specific improvement also.

Coverage

Coverage can be observed from the model generated families of characteristics curves.

All three example tube models, that is for the 12AX7, 6SN7 and 6BQ5 generate curves that are broadly in agreement with the full range of manufacturer data, albeit with reduced correspondence in narrow regions adjacent to the axes of the plate and grid characteristics.

Tube regions commonly excluded from general data manuals are not covered by the model extensions e.g. the thermionic emission saturation region.

FURTHER DEFINITIONS AND EMBODIMENTS

In the above-description of various embodiments of the present disclosure, aspects of the present disclosure may be illustrated and described herein in any of a number of patentable classes or contexts including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "circuit" "module," "component," or "system." Furthermore, aspects of the present disclosure may take the form of a computer program product comprising one or more computer readable media having computer readable program code embodied thereon.

Any combination of one or more computer readable media may be used. The computer readable media may be a computer readable signal medium or a computer readable storage medium. A computer readable storage medium may be, for example, but not limited to, an electronic, magnetic, optical, electromagnetic, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), an appropriate optical fiber with a repeater, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable signal medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C#, VB.NET, Python or the like, conventional procedural programming languages, such as the "C" programming language, Visual Basic, Fortran 2003, Perl, COBOL 2002, PHP, ABAP, LabVIEW, dynamic programming languages, such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable instruction execution apparatus, create a mechanism for implementing the functions/acts specified in the flowchart and/or block diagram block or blocks.

These computer program instructions may also be stored in a computer readable medium that when executed can direct a computer, other programmable data processing apparatus, or other devices to function in a particular manner, such that the instructions when stored in the computer readable medium produce an article of manufacture including instructions which when executed, cause a computer to implement the function/act specified in the flowchart and/or block diagram block or blocks. The computer program instructions may also be loaded onto a computer, other programmable instruction execution apparatus, or other devices to cause a series of operational steps to be performed on the computer, other programmable apparatuses or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods, and computer program products according to various aspects of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The present disclosure of embodiments has been presented for purposes of illustration and description, but is not intended to be exhaustive or limited to the disclosure in the form disclosed. Many variations and modifications can be made to the embodiments without substantially departing from the principles of the present invention. All such variations and modifications are intended to be included herein within the scope of the present invention.

What is claimed is:

1. A method, comprising:
performing by a processor:
estimating a total cathode space current for a thermionic vacuum tube having at least one grid and a plate, such that at least one amplification factor associated with the at least one grid is determined by a polynomial based on a variable that represents at plurality of voltages associated with the at least one grid and the plate, the variable being heuristically determined.

2. The method of claim 1, wherein the polynomial is a univariate polynomial.

3. The method of claim 2, wherein the at least one grid comprises a plurality of grids having a plurality of amplification factors associated therewith and wherein the variable $x(e_1, e_2, \ldots, e_b)$ is given as:

$$x(e_1, e_2, \ldots, e_b) = \frac{e_1 + \varepsilon}{\left(\frac{e_2}{\mu_2} + \frac{e_3}{\mu_3} + \ldots + \frac{e_b}{\mu}\right)}$$

wherein $\varepsilon$ is a correction constant for initial velocity effects and contact potential on a first one of the plurality of grids $e_1$;
wherein $e_2, \ldots, e_n$ are the voltages associated with second through nth ones of the plurality of grids, respectively;
wherein $\mu_2, \ldots, \mu_n$ are the plurality of amplification factors of the first one of the plurality of grids associated with the second through nth ones of the plurality of grids;
wherein $e_b$ is the plate voltage; and
wherein $\mu$ is an amplification factor associated with a first one of the plurality of grids with respect to the plate.

4. The method of claim 3, wherein the plurality of amplification factors $\mu_k$ are given by $$\mu'_k(x) = \sum_{i=0}^{n} a_{k,i} \cdot \text{Min}(0, x(e_1, e_2, \ldots, e_b))^i$$

wherein $a_{k,i}$ are fitting constants based on characteristics of the thermionic vacuum tube and k refers to an electrode; and
wherein a respective amplification factor $\mu_k'$ is represented by the constant $a_{k,0}$ when the associated grid carries a positive current thereon.

5. The method of claim 1, wherein the at least one grid comprises a plurality of grids, the method further comprising:
determining a plurality of currents associated with the plurality of grids, respectively, based on a plurality of current ratios of the plurality of currents associated with the plurality of grids to a plate current.

6. The method of claim 5, wherein the plurality of ratios is based on a plate voltage and the plurality of voltages associated with the plurality of grids, respectively.

7. The method of claim 6, wherein the plurality of ratios $D_j$ are given by $$D_j \approx \left(1 + \frac{1}{25r_j}\right)^{4 \cdot S\left(\frac{e_b}{e_j}\right)} \cdot \delta_j \cdot \left(\frac{e_b}{e_j}\right)^{r_j \left(1 + 3 \cdot S\left(\frac{e_b}{e_j}\right)\right)}$$

wherein $S(w) = e^{-w}, w > 0$;

wherein $\varepsilon$ is a correction constant for initial velocity effects and contact potential on a first one of the plurality of grids $e_i$;
wherein $e_j$=a control grid voltage $e_1 + \varepsilon$ of the first one of the plurality of grids or a screen grid voltage $e_2$ of a second one of the plurality of grids;
wherein $\delta_j$=current division factor, measured by a ratio of plate current to respective current associated with a respective one of the plurality of grids for equal plate and positive grid voltages;
wherein $r_j$=grid dependent inverse power law; and
wherein $e_b$ is the plate voltage.

8. The method of claim 7, wherein the thermionic vacuum tube is a triode and $r_j=\frac{1}{2}$.

9. The method of claim 7, wherein the thermionic vacuum tube is a tetrode or a pentode in the tetrode configuration and $r_j=\frac{1}{5}$.

10. The method of claim 1, wherein the thermionic vacuum tube is a triode with one grid and the plate current $I_b$ is given by $$I_b = I_{sp} \cdot \left( \frac{1 + \frac{k_1}{D_1} \cdot T(e_1, e_b)}{1 + \frac{k_1}{D_1}} \right)$$

$$T(e_1, e_b) = e^{\frac{-(e_1+\varepsilon)}{\left(\frac{e_b}{\mu}\right)}}, \quad (e_1+\varepsilon) > 0$$

wherein $$k_1 = \begin{cases} 0, & (e_1+\varepsilon) \le 0 \\ 1, & (e_1+\varepsilon) > 0 \end{cases};$$

wherein Isp is a total space current associated with the thermionic vacuum tube;

wherein $\varepsilon$ is a correction constant for initial velocity effects;

wherein $e_b$ is the plate voltage;

wherein $e_1$ is the grid voltage;

wherein $D_1$ is a current ratio a grid to a plate current; and wherein $\mu$ is an amplification factor associated with the first one of the plurality of grids with respect to the plate.

11. The method of claim 7, wherein the thermionic vacuum tube is a tetrode or pentode and the plate current $I_b$ is given by $$I_b = I_{sp} \cdot \left( \frac{1 + \frac{k_1}{D_1} \cdot T(e_1, e_b)}{1 + \frac{k_1}{D_1} + \frac{k_2}{D_2}} \right)$$

$$T(e_1, e_b) = e^{\frac{-(e_1+\varepsilon)}{\left(\frac{e_b}{\mu_2}\right)}}, \quad (e_1+\varepsilon) > 0$$

wherein $$k_1 = \begin{cases} 0, & (e_1+\varepsilon) \le 0 \\ 1, & (e_1+\varepsilon) > 0 \end{cases} \text{ and}$$

$$k_2 = 1, \quad e_2 > 0$$

wherein $\varepsilon$ is a correction constant for initial velocity effects and contact potential on a first one of the plurality of grids $e_1$;

wherein $\mu_2$ is the amplification factor of the first grid associated with the second one of the plurality of grids; and wherein $\mu$ is an amplification factor associated with the first one of the plurality of grids with respect to the plate.

12. The method of claim 1, wherein the thermionic vacuum tube is a circuit element in a plurality of interconnected circuit elements, the method further comprising:

using the estimate of the total cathode space current to determine an operational effect on at least one other one of the plurality of interconnected circuit elements.

13. The method of claim 1, further comprising:

receiving a digitized audio signal; and modifying the digitized audio signal based on the estimate of the total cathode space current.

14. The method of claim 13, further comprising:

converting the digitized audio signal that was modified to an analog signal.

15. A system, comprising:

a processor; and a memory coupled to the processor and comprising computer readable program code embodied in the memory that is executable by the processor to perform operations comprising:

estimating a total cathode space current for a thermionic vacuum tube having at least one grid and a plate, such that at least one amplification factor associated with the at least one grid is determined by a polynomial based on a variable that represents at plurality of voltages associated with the at least one grid and the plate, the variable being heuristically determined.

16. The system of claim 15, wherein the at least one grid comprises a plurality of grids, the operations further comprising:

determining a plurality of currents associated with the plurality of grids, respectively, based on a plurality of current ratios of the plurality of currents associated with the plurality of grids to a plate current.

17. The system of claim 15, wherein the thermionic vacuum tube is a triode with one grid and the plate current $I_b$ is given by $$I_b = I_{sp} \cdot \left( \frac{1 + \frac{k_1}{D_1} \cdot T(e_1, e_b)}{1 + \frac{k_1}{D_1}} \right)$$

$$T(e_1, e_b) = e^{\frac{-(e_1+\varepsilon)}{\left(\frac{e_b}{\mu}\right)}}, \quad (e_1+\varepsilon) > 0$$

wherein $$k_1 = \begin{cases} 0, & (e_1+\varepsilon) \le 0 \\ 1, & (e_1+\varepsilon) > 0 \end{cases};$$

wherein Isp is a total space current associated with the thermionic vacuum tube;

wherein $\varepsilon$ is a correction constant for initial velocity effects;

wherein $e_b$ is the plate voltage;

wherein $e_1$ is the grid voltage;

wherein $D_1$ is a current ratio a grid to a plate current; and wherein $\mu$ is an amplification factor associated with the first one of the plurality of grids with respect to the plate.

18. A computer program product, comprising:

a tangible computer readable storage medium comprising computer readable program code embodied in the medium that when executed by a processor causes the processor to perform operations comprising:

estimating a total cathode space current for a thermionic vacuum tube having at least one grid and a plate, such that at least one amplification factor associated with the at least one grid is determined by a polynomial based on a variable that represents at plurality of voltages associated with the at least one grid and the plate, the variable being heuristically determined.

19. The computer program product of claim 18, wherein the at least one grid comprises a plurality of grids, the operations further comprising:

determining a plurality of currents associated with the plurality of grids, respectively, based on a plurality of current ratios of the plurality of currents associated with the plurality of grids to a plate current.

20. The computer program product of claim 18, wherein the thermionic vacuum tube is a triode with one grid and the plate current $I_b$ is given by $$I_b = I_{sp} \cdot \left( \frac{1 + \frac{k_1}{D_1} \cdot T(e_1, e_b)}{1 + \frac{k_1}{D_1}} \right)$$

$$T(e_1, e_b) = e^{\frac{-(e_1 + \varepsilon)}{\left(\frac{e_b}{\mu}\right)}}, \quad (e_1 + \varepsilon) > 0$$

wherein $$k_1 = \begin{cases} 0, & (e_1 + \varepsilon) \leq 0 \\ 1, & (e_1 + \varepsilon) > 0 \end{cases};$$

wherein Isp is a total space current associated with the thermionic vacuum tube;
wherein ε a is a correction constant for initial velocity effects;
wherein $e_b$ is the plate voltage;
wherein $e_1$ is the grid voltage;
wherein $D_1$ is a current ratio a grid to a plate current; and
wherein μ is an amplification factor associated with the first one of the plurality of grids with respect to the plate.

* * * * *

UNITED STATES PATENT AND TRADEMARK OFFICE
CERTIFICATE OF CORRECTION

Page 1 of 2

PATENT NO. : 11,152,181 B2
APPLICATION NO. : 16/415150
DATED : October 19, 2021
INVENTOR(S) : Panayotis Tsambos It is certified that error appears in the above-identified patent and that said Letters Patent is hereby corrected as shown below:

On the Title Page

Item (56) References Cited, OTHER PUBLICATIONS, Page 2, Column 2, Line 13: Please correct "1996" to read -- 1969 --

In the Specification

Column 2, Line 44: Please correct "$\alpha_{k,i}$" to read -- $a_{k,i}$ --

Column 2, Line 47: Please correct "$\alpha_{k,0}$" to read -- $a_{k,0}$ --

Column 3, Line 1: Please correct "w>0; ε wherein" to read -- w>0; wherein --

Column 3, Line 3: Please correct "$e_j$=a control grid" to read -- $e_j$=a control grid --

Column 4, Line 28: Please correct "$e_2,...,\mu_n$" to read -- $e_2,...,e_n$ --

Column 4, Line 44: Please correct "$\alpha_{k,i}$" to read -- $a_{k,i}$ --

Column 4, Line 47: Please correct "$\alpha_{k,0}$" to read -- $a_{k,0}$ --

Column 6, Line 44: Please correct "$\alpha_{k,i}$" to read -- $a_{k,i}$ --

Column 6, Line 47: Please correct "$\alpha_{k,0}$" to read -- $a_{k,0}$ --

Column 7, Line 1: Please correct "$s(w)=e^{-w}$" to read -- $S(w)=e^{-w}$ --

Column 7, Line 3: Please correct "$e_j$=a control grid" to read -- $e_j$=a control grid --

Column 9, Line 52: Please correct "$e_b \leq 0.259 e_2$" to read -- $e_b \leq 0.25 e_2$ --

Signed and Sealed this
Twelfth Day of July, 2022

Katherine Kelly Vidal
*Director of the United States Patent and Trademark Office*

CERTIFICATE OF CORRECTION (continued)
U.S. Pat. No. 11,152,181 B2

Column 15, Line 7: Please correct "$\alpha_{k,i}$" to read -- $a_{k,i}$ --

Column 15, Line 11: Please correct "$\alpha_{k,0}$" to read -- $a_{k,0}$ --

Column 15, Line 14: Please correct "$\alpha_{k,i}$" to read -- $a_{k,i}$ --

Column 15, Line 61: Please correct "$D_j(e_i,e_b)$" to read -- $D_j(e_j,e_b)$ --

Column 16, Line 26: Please correct "$r_1=½$" to read -- $r_1=½,$ --

Column 16, Line 29: Please correct "3.360" to read -- 1.360 --

Column 19, Lines 7-9: Please correct "$x(e_1, e_2, e_b) = \dfrac{e_1 \varepsilon}{\left(\dfrac{e_2}{\mu_2} + \dfrac{e_b}{\mu}\right)}$" to read -- $x(e_1, e_2, e_b) = \dfrac{e_1 + \varepsilon}{\left(\dfrac{e_2}{\mu_2} + \dfrac{e_b}{\mu}\right)}$ --

Column 22, Line 64: Please correct "$e_1+\delta$" to read -- $e_1+\varepsilon$ --

Column 25, Line 37, Table VIII: Please correct "pentode $\mu_x$" to read -- pentode $\mu_z$ --

In the Claims

Column 33, Line 20, Claim 20: Please correct "$\varepsilon$ a is a correction" to read -- $\varepsilon$ is a correction --